United States Patent
Suzuki et al.

(10) Patent No.: US 8,022,944 B2
(45) Date of Patent: Sep. 20, 2011

(54) INPUTTING DEVICE AND MOBILE TERMINAL

(75) Inventors: Daisuke Suzuki, Tokyo (JP); Tatsuya Uchikawa, Tokyo (JP); Hiroyuki Kiuchi, Tokyo (JP); Mitsutaka Shiraishi, Saitama (JP); Takao Ito, Saitama (JP); Ryuji Matsuo, Saitama (JP)

(73) Assignees: NEC Corporation, Tokyo (JP); NTT DoCoMo, Inc., Tokyo (JP)

( * ) Notice: Subject to any disclaimer, the term of this patent is extended or adjusted under 35 U.S.C. 154(b) by 1139 days.

(21) Appl. No.: 10/623,568

(22) Filed: Jul. 22, 2003

(65) Prior Publication Data

US 2004/0119687 A1 Jun. 24, 2004

(30) Foreign Application Priority Data

Jul. 26, 2002 (JP) ................. 2002-218742

(51) Int. Cl.
*G06F 3/033* (2006.01)
*G09G 5/00* (2006.01)
(52) U.S. Cl. ............ 345/184; 345/156; 345/157; 463/37
(58) Field of Classification Search .......... 345/156–184; 463/36–38
See application file for complete search history.

(56) References Cited

U.S. PATENT DOCUMENTS

| 5,012,230 | A  | * | 4/1991  | Yasuda         | 345/160 |
|-----------|----|---|---------|----------------|---------|
| 6,326,948 | B1 |   | 12/2001 | Kobachi et al. |         |
| 6,373,265 | B1 |   | 4/2002  | Morimoto et al.|         |
| 6,400,353 | B1 | * | 6/2002  | Ikehara et al. | 345/157 |
| 6,967,642 | B2 | * | 11/2005 | SanGiovanni    | 715/702 |
| 2001/0007449 | A1 | * | 7/2001 | Kobachi et al. | 345/156 |
| 2002/0097224 | A1 | * | 7/2002 | Nishino et al. | 345/161 |
| 2003/0080946 | A1 | * | 5/2003 | Chuang         | 345/173 |
| 2003/0206154 | A1 | * | 11/2003 | Hill et al.   | 345/168 |
| 2004/0080491 | A1 | * | 4/2004 | Takatsuka et al.| 345/156 |

FOREIGN PATENT DOCUMENTS

| CN | 1167679 A    |   | 12/1997 |
|----|--------------|---|---------|
| EP | 1 193 643 A1 |   | 4/2002  |
| EP | 1 223 541 A2 |   | 7/2002  |
| JP | 3-77222 A    |   | 4/1991  |
| JP | 4-125723 A   |   | 4/1992  |
| JP | 7-262879 A   |   | 10/1995 |
| JP | 2001-135196  | * | 5/2001  |
| JP | 2001-222379 A|   | 8/2001  |
| JP | 2002-23920 A |   | 1/2002  |
| JP | 2004-31177 A |   | 1/2004  |

* cited by examiner

*Primary Examiner* — Seokyun Moon
(74) *Attorney, Agent, or Firm* — Sughrue Mion, PLLC

(57) ABSTRACT

Provided is an inputting device that is disposed in an opening of a cabinet surface. The device includes an elastic sheet having an outside surface disposed on an inside surface of the cabinet including the opening and across the opening. A sliding key is fixed on the outside surface of the elastic sheet with at least a portion in the opening of said cabinet surface. The device also includes sensors to detect movement, in a horizontal direction that is substantially parallel to said cabinet surface, of the sliding key. The device also includes guides being possible to be recognized optically that are disposed on designated positions on the elastic sheet, and the sensors detect the moved direction and the amount of the horizontal movement of the sliding key by reading the movements of said guides optically.

47 Claims, 15 Drawing Sheets

F I G. 1
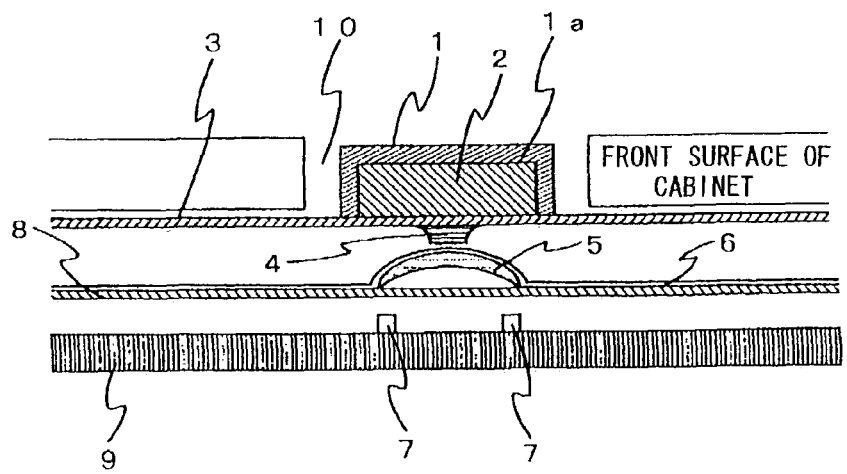
F I G. 2
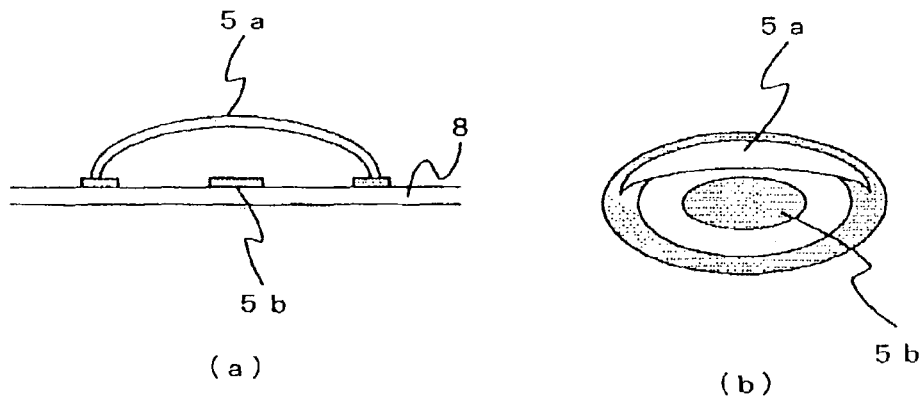
(a)
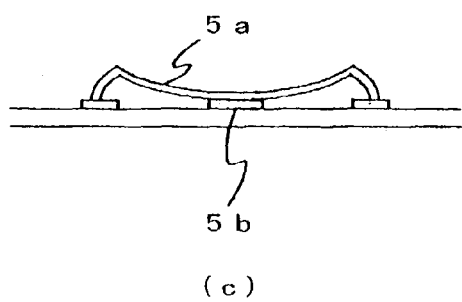
(c)

F I G. 3
(a) 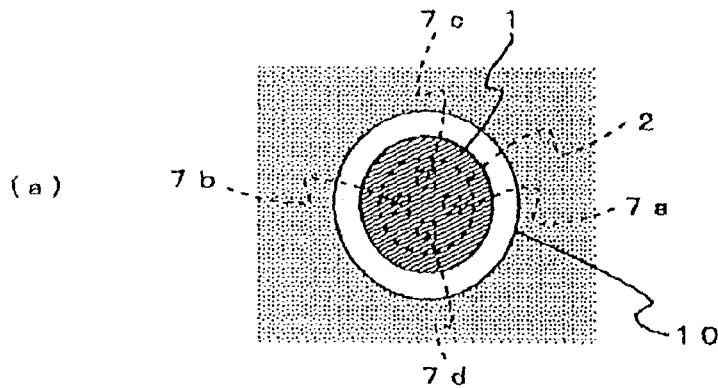
(b) 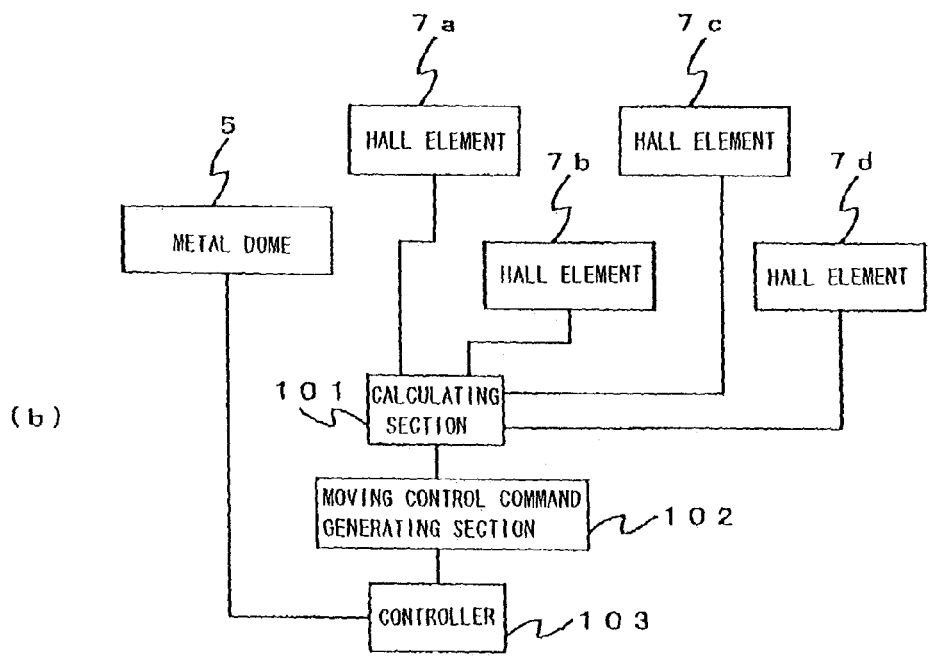
(c) 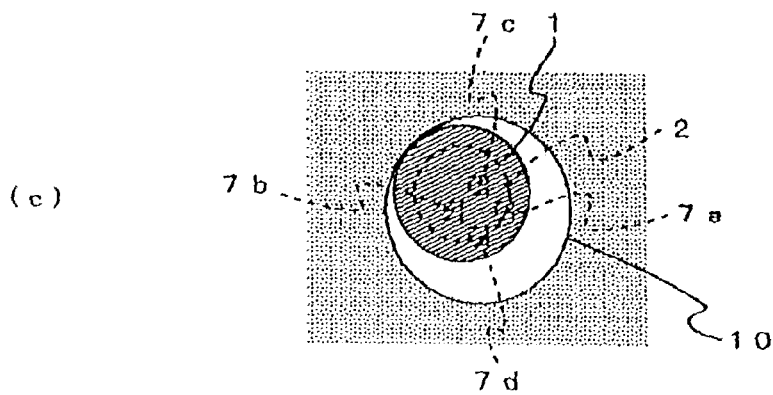

F I G. 4
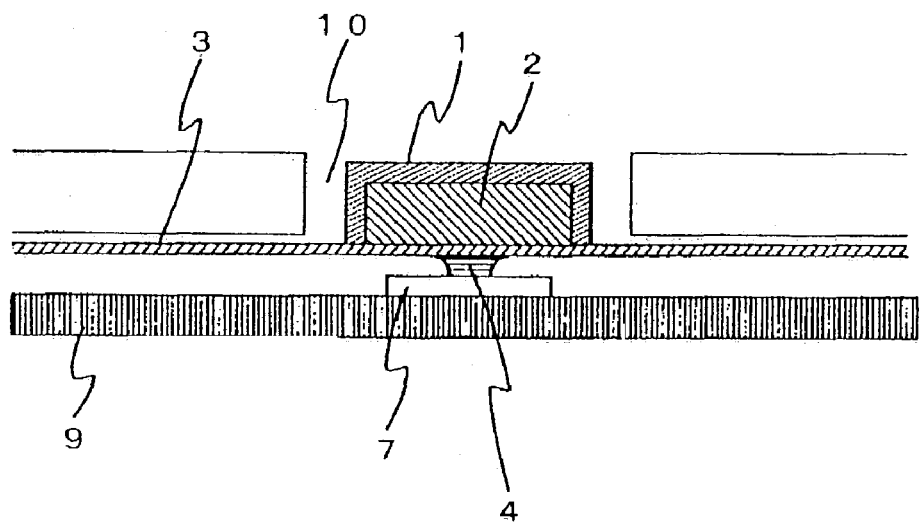
F I G. 5
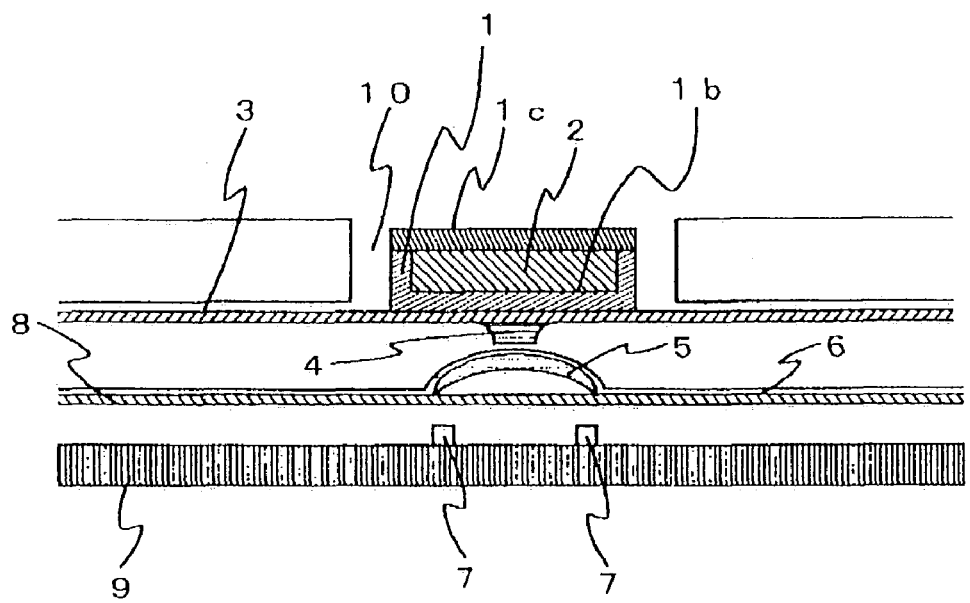

F I G. 6
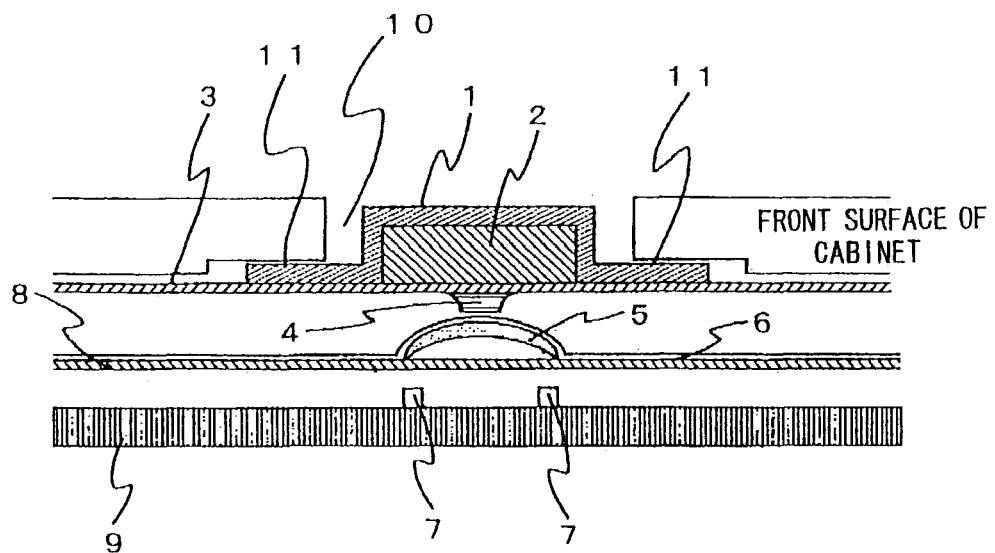
F I G. 7
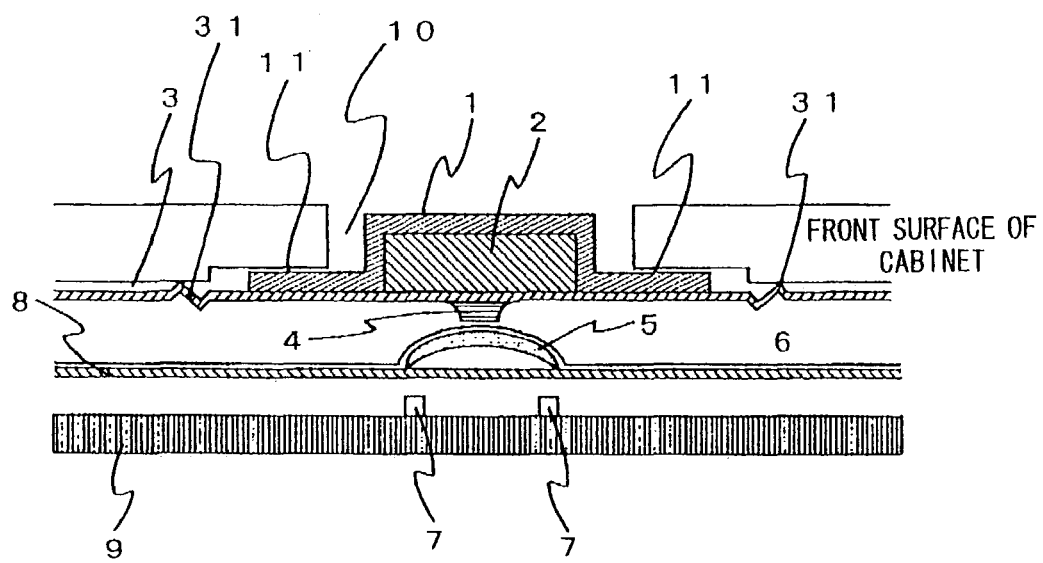

F I G. 12
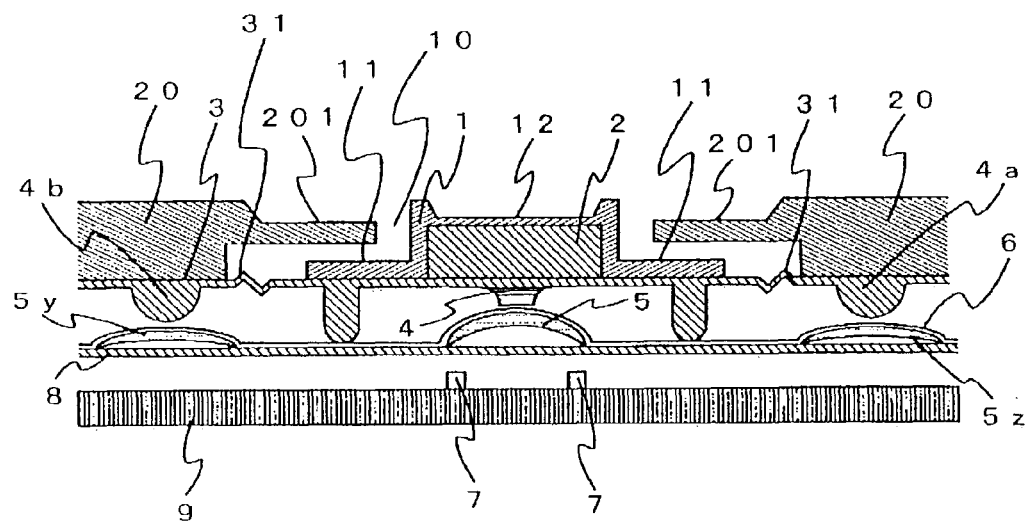
F I G. 13
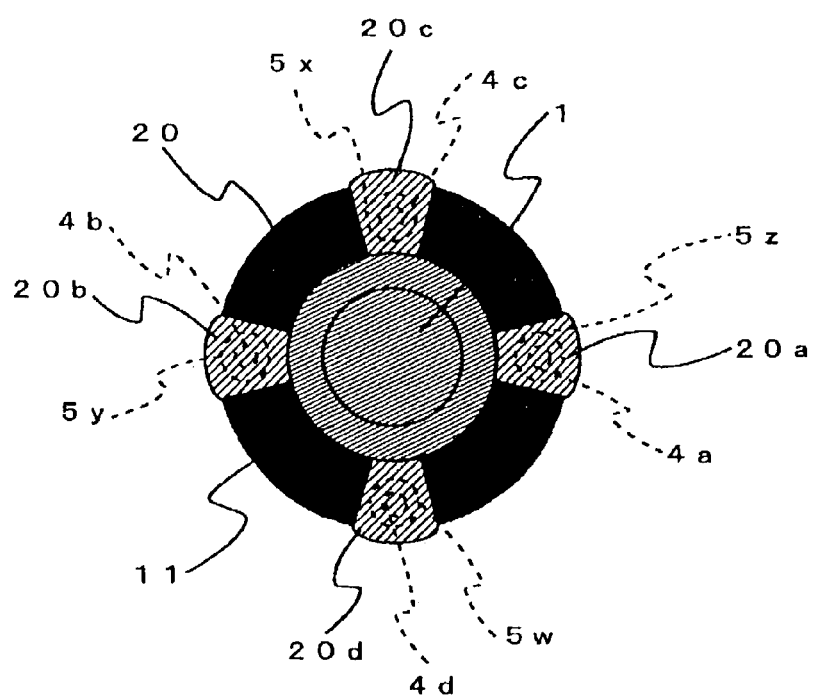

F I G. 15
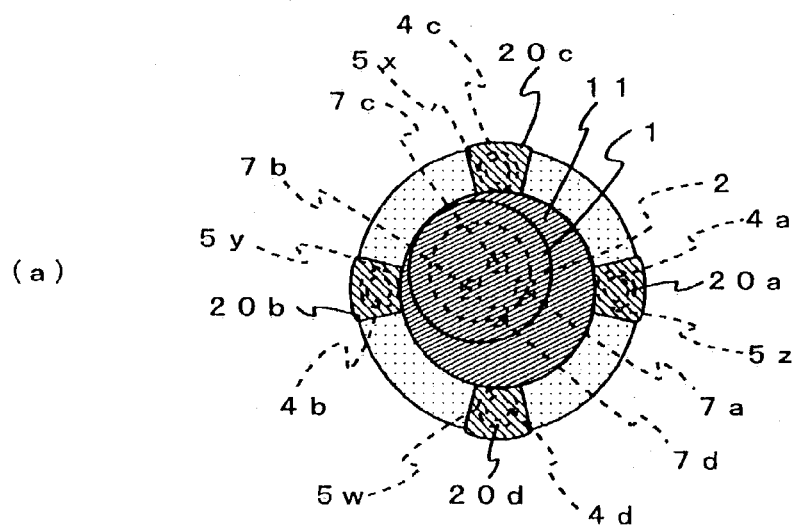
(a)
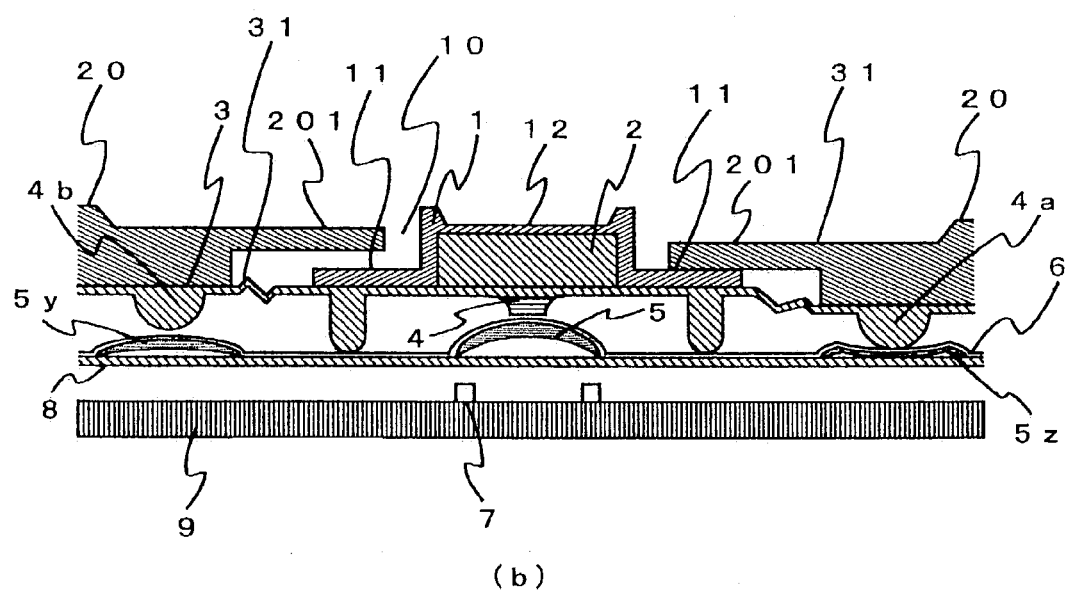
(b)

F I G. 18
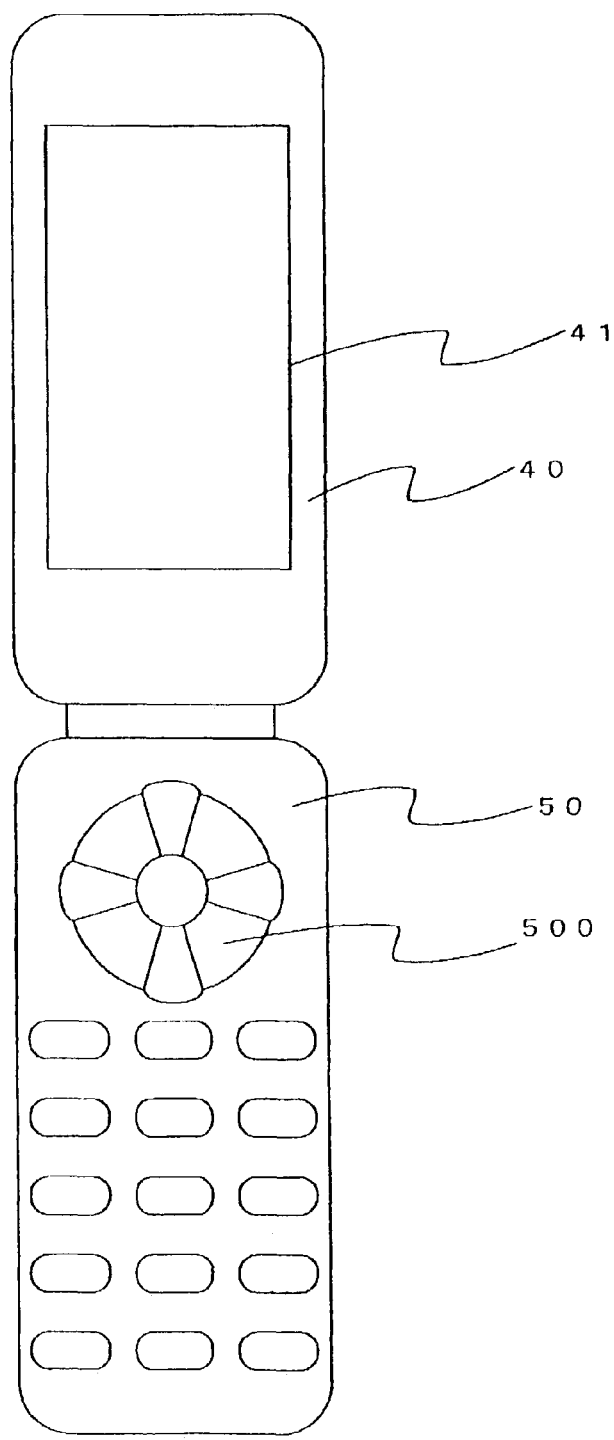

F I G. 23
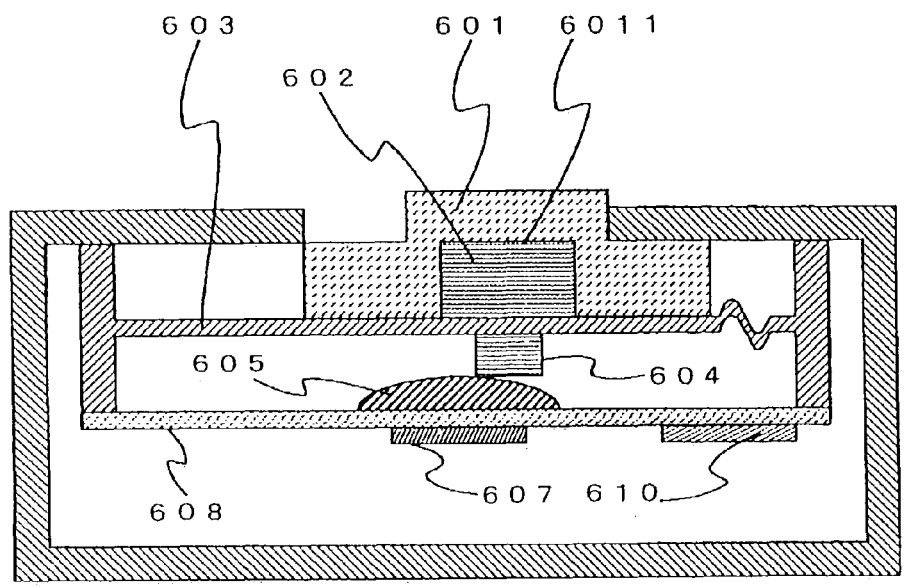
F I G. 24
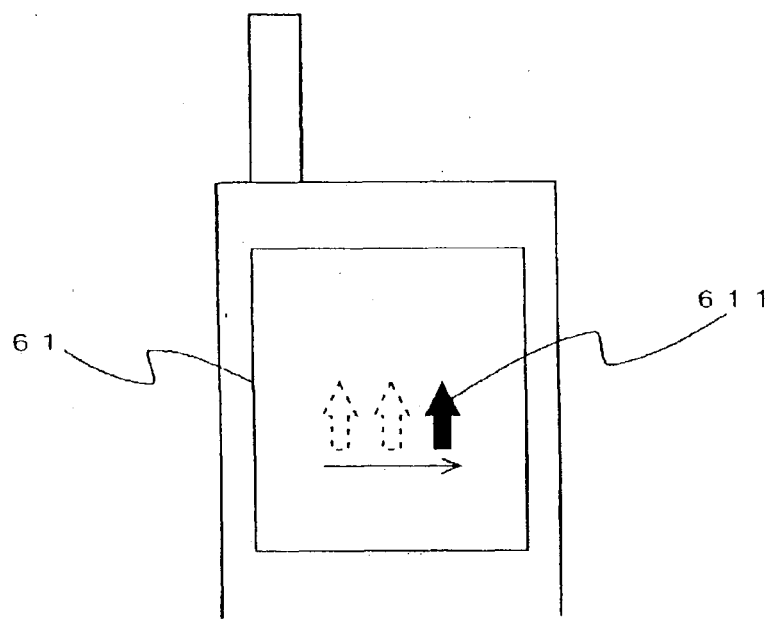

INPUTTING DEVICE AND MOBILE TERMINAL

BACKGROUND OF THE INVENTION

The present invention relates to an inputting device and a mobile terminal used this inputting device, in particular, which provides an operating key that is moved in the almost parallel and perpendicular directions to the surface of the cabinet of the mobile terminal, and which detects the movement of the operating key in the oblique direction on the almost parallel surface of the cabinet.

DESCRIPTION OF THE RELATED ART

Many electronic instruments such as mobile communication terminals and personal digital assistants (PDA) provide an inputting device called as a pointing device. The user of the mobile terminal can move the subjects to be controlled such as a cursor, a pointer, and a focus on a display by operating the pointing device.

In case of the mobile communication terminal, a pointing device, which moves the subjects to be controlled by using inputting keys (direction keys) corresponding to the length directions and the width directions on the display, has been widely used. The pointing device using the direction keys detects a key input operation by a user and converts the detected key input operation into a moving control command to the subject to be controlled in the length direction and the width direction.

Recently, applications executing on the mobile communication terminal have been multi-functions, and the necessity, which the subjects to be controlled are moved not only in the length directions and the width directions on the display but also in the oblique directions on the display, has been largely increased. However, the pointing device used the direction keys has not been designed by having a premise that the subjects to be controlled are moved in the oblique directions. Therefore, in case that the length direction key and the width direction key are pushed at the same time, the subject to be controlled is only moved to the 45° for the length direction and the width direction on the display. That is, the pointing device used the direction keys has not been able to make the subject to be controlled move in an arbitrary direction.

There is a stick type pointing device (joystick), as a pointing device by which the subject to be controlled can be moved in an arbitrary direction. At the joystick, by slanting a lever back and forth and right and left, the moving control command can be given to the subject to be controlled on the display in the arbitrary direction.

However, the mobile communication terminal has been required to be small and thin, consequently, it is not desirable that a pointing device has a structure in which a lever sticking out of the surface of the cabinet is assembled in the mobile communication terminal. And even if the part sticking out of the surface of the cabinet is made to be short, since the length is short, the lever becomes not enough to be moved, and the operation ability is decreased.

Japanese Patent Application Laid-Open No. HEI 4-125723 discloses a pointing control device. This patent application has purposes that a pointing device can be assembled in a small size computer and its operation ability is good. In this pointing control device, the pointing device, in which the moving control command can be given to the subject to be controlled on the display in the arbitrary direction, is formed by a structure. This structure does not have a part sticking out of the cabinet, and makes a plate type slider being capable of moving in the arbitrary direction detect the amount of movement per unit time.

However, this pointing control device has a complex structure that needs a housing to support the plate type slider, and it is difficult to make the pointing device small and thin. Therefore, this pointing control device is not desirable to apply the mobile communication terminal that requires to be small and thin.

Furthermore, since this pointing control device has not been designed for applying to the mobile communication terminal as its premise, the waterproof and the dustproof have not been considered. Therefore, this pointing control device is not desirable to apply to the mobile communication terminal, because the mobile communication terminal is frequently used outdoors and there is a possibility that a drop of water and dust hit the cabinet of the mobile communication terminal.

As mentioned above, the following conditions are required for the pointing device to be applied to the mobile communication terminal. That is, first, the moving control command to the subject to be controlled can be formed on the display in an arbitrary direction. Second, the structure does not have a part sticking out of the cabinet. Third, the structure is not complex. And fourth, the waterproof and the dustproof are provided.

SUMMARY OF THE INVENTION

It is therefore an object of the present invention to provide an inputting device and a mobile terminal used this inputting device, in particular, in which a moving control command to a subject to be controlled is formed on a display in an arbitrary direction and the waterproof and the dustproof are provided and whose structure does not have a part sticking out of the surface of the cabinet or has the part sticking out of the surface of the cabinet as small as possible even if it has the sticking out part and whose structure is simple.

According to a first aspect of the present invention, for achieving the object mentioned above, there is provided an inputting device, which is disposed in an opening part of a cabinet. In this, a plane being about parallel to the front surface of the cabinet is defined as an XY plane in an XY orthogonal coordinate system. The inputting device provides an elastic sheet that is made of a material having elasticity and flexibility or having only elasticity and is disposed inside the cabinet in about parallel to the XY plane in a state that the front surface of the elastic sheet faces the rear surface of the front side of the cabinet, a sliding key that is fixed tightly on the front surface of the elastic sheet so that the sliding key is disposed at an about center of the opening part in a state that the sliding key is possible to move in an arbitrary direction on the XY plane, and sensors that at least detect the moved direction of the sliding key on the XY plane. The inputting device, further provides a first control signal generating means that generates a first control signal corresponding to at least the moved direction of the sliding key detected by the sensors. And the first control signal executes the change of the position of a subject to be controlled on a display.

According to the present invention, in the first aspect, the sliding key has a rim part whose diameter is larger than that of the opening part, and the sliding key is adhered to the elastic sheet at the rim part, and a space is formed on a part of the rear surface of the cabinet at the position adjoining the opening part, and about the edge part of the rim part of the sliding key is disposed in the space.

According to a second aspect of the present invention, there is provided an inputting device, which is disposed in an opening part of a cabinet. In this, a plane being about parallel to the front surface of the cabinet is defined as an XY plane in an XY orthogonal coordinate system. The inputting device provides an elastic sheet that is made of a material having elasticity and flexibility or having only elasticity and is disposed inside the cabinet in about parallel to the XY plane in a state that the front surface of the elastic sheet faces the rear surface of the front side of the cabinet, a surrounding key being a ring shape that is fixed tightly on the front surface of the elastic sheet, a sliding key that is fixed tightly on the front surface of the elastic sheet so that, the sliding key is disposed at an about center of the opening part in a state that the sliding key is possible to move in an arbitrary direction on the XY plane, sensors that at least detect the moved direction of the sliding key on the XY plane, and switches that detect whether the surrounding key is pushed in one direction in the XY directions or not. The inputting device, further provides a first control signal generating means that generates a first control signal corresponding to at least the moved direction of the sliding key detected by the sensors, and a second control signal generating means that generates a second control signal corresponding to the pushed direction of one of the edges of the surrounding key detected by one of the switch. And the first control signal and the second control signal execute the change of the position of a subject to be controlled on a display.

According to the present invention, in the second aspect, the sliding key has a rim part whose diameter is larger than that of the opening part, and the sliding key is adhered to the elastic sheet at the rim part, and a space is formed on a part of the rear surface of the surrounding key, and about the edge part of the rim part of the sliding key is disposed in the space.

According to the present invention, in the first and second aspect, a magnet is disposed in the sliding key, and the sensors detect the moved direction and the amount of the movement of the sliding key on the XY plane based on the change of the magnetic flux density from the magnet corresponding to the movement of the sliding key. And the sliding key provides a concave part on a part of the surface where the sliding key is adhered to the elastic sheet, and the sliding key is adhered to the elastic sheet by disposing the magnet in the concave part, and the magnet is sealed in the sliding key. Or guides being possible to be recognized optically are disposed on designated positions on the elastic sheet, and the sensors detect the moved direction and the amount of the movement of the sliding key on the XY plane by reading the movements of the guides optically corresponding to the movement of the sliding key. Or a coil is disposed in the sliding key, and the sensors detect the moved direction and the amount of the movement of the sliding key on the XY plane based on the electromotive force generated by the electromagnetic induction by the movement of the sliding key in the magnetic field of designated power formed at the surrounding part of the coil.

According to the present invention, in the first and second aspect, the inputting device, further provides a pushing component, which is made of a material that is harder than the elastic sheet and whose friction factor is smaller than that of the elastic sheet, and which is disposed on the rear surface of the elastic sheet at the position corresponding to the sliding key, a contact switch that detects that the sliding key was pushed in the inside direction of the cabinet by disposing at the position facing the pushing component, and a third control signal generating means that generates a third control signal when the pushing component made the contact switch work. And the third control signal executes the selection or the decision of information indicating by a subject to be controlled on a display. And the inputting device, further provides an ignoring means that ignores the third control signal, in case that the amount of the movement of the sliding key on the XY plane is larger than a designated value. And the inputting device, further provides a printed circuit board on which the contact switch is disposed, and a sheet that covers the printed circuit board disposed the contact switch. And the inputting device, further provides a bellows having a ring shape formed in the elastic sheet outside the position where the sliding key is adhered to the elastic sheet. And the inputting device, further provides at least one of projections supporting the sliding key on the rear surface of the elastic sheet. And the inputting device, further provides a concave part formed on the front surface of the sliding key. And the inputting device further provides a nonskid component disposed on the front surface of the sliding key. And the inputting device, further provides one or more projections formed on the front surface of the sliding key. And a group of keys except the sliding key is also formed on the front surface of the elastic sheet in a unified state.

According to a third aspect of the present invention, for achieving the object mentioned above, there is provided a mobile terminal. In this, a plane being about parallel to the front surface of a cabinet of a mobile terminal is defined as an XY plane in an XY orthogonal coordinate system. The mobile terminal provides a cabinet providing an opening part, an elastic sheet that is made of a material having elasticity and flexibility or having only elasticity and is disposed inside the cabinet in about parallel to the XY plane in a state that the front surface of the elastic sheet faces the rear surface of the front side of the cabinet, a sliding key that is fixed tightly on the front surface of the elastic sheet so that the sliding key is disposed at an about center of the opening part in a state that the sliding key is possible to move in an arbitrary direction on the XY plane, sensors that at least detect the moved direction of the sliding key on the XY plane, a displaying means that displays information, and a first controlling means that executes first control corresponding to at least the moved direction of the sliding key on the XY plane detected by the sensors.

According to the present invention, in the third aspect, the mobile terminal, further provides a pushing component, which is made of a material that is harder than the elastic sheet and whose friction factor is smaller than that of the elastic sheet, and which is disposed on the rear surface of the elastic sheet at the position corresponding to the sliding key, a contact switch that detects that the sliding key was pushed in the inside direction of the cabinet by disposing at the position facing the pushing component, and a third controlling means that executes third control when the pushing component made the contact switch work. And the sensors detect the moved direction and the amount of the movement of the sliding key on the XY plane, and the first controlling means executes the first control corresponding to the moved direction and the amount of the movement of the sliding key. And the mobile terminal, further provides a control stopping means that stops the third controlling means, in case that the amount of the movement of the sliding key on the XY plane is larger than a designated value. And the mobile terminal, further provides a printed circuit board on which the contact, switch is disposed, and a sheet that covers the printed circuit board disposed the contact switch. And the first controlling means executes the change of the position displaying a subject to be controlled on the displaying means. And the third controlling means executes the selection or the decision of information indicating by the subject to be controlled on the displaying means. And the sliding key has a rim part whose diameter is larger than that of the opening part, the sliding key is adhered to the elastic sheet at the rim part, and a space is formed on a part of the rear surface of the cabinet at the position adjoining the opening part, and about the edge part of the rim part of the sliding key is disposed in the space.

According to a fourth aspect of the present invention, there is provided a mobile terminal. In this, a plane being about parallel to the front surface of a cabinet of a mobile terminal is defined as an XY plane in an XY orthogonal coordinate system. The mobile terminal provides a cabinet providing an opening part, an elastic sheet that is made of a material having elasticity and flexibility or having only elasticity and is disposed inside the cabinet in about parallel to the XY plane in a state that the front surface of the elastic sheet faces the rear surface of the front side of the cabinet, a surrounding key being a ring shape that is fixed tightly on the front surface of the elastic sheet, a sliding key that is fixed tightly on the front surface of the elastic sheet so that the sliding key is disposed at an about center of the opening part in a state that the sliding key is possible to move in an arbitrary direction on the XY plane, sensors that at least detect the moved direction of the sliding key on the XY plane, a displaying means that displays information, a first controlling means that executes first control corresponding to at least the moved direction of the sliding key on the XY plane detected by the sensors, and a second controlling means that executes second control corresponding to the pushed direction of one of the edge parts of the surrounding key.

According to the present invention, in the fourth aspect, the mobile terminal, further provides a pushing component, which is made of a material that is harder than the elastic sheet and whose friction factor is smaller than that of the elastic sheet, and which is disposed on the rear surface of the elastic sheet at the position corresponding to the sliding key, a contact switch that detects that the sliding key was pushed in the inside direction of the cabinet by disposing at the position facing the pushing component, and a third controlling means that executes third control when the pushing component made the contact switch work. And the sensors detect the moved direction and the amount, of the movement of the sliding key on the XY plane, and the first controlling means executes the first control corresponding to the moved direction and the amount of the movement of the sliding key. And the mobile terminal, further provides a control stopping means that stops the third controlling means, in case that the amount of the movement of the sliding key on the XY plane is larger than a designated value. And the mobile terminal, further provides a printed circuit board on which the contact switch is disposed, and a sheet that covers the printed circuit board disposed the contact switch. And the first controlling means and the second controlling means execute the change of the position displaying a subject to be controlled on the displaying means. And the third controlling means executes the selection or the decision of information indicating by the subject to be controlled on the displaying means. And the first controlling means executes the change of the position displaying a first subject to be controlled on the displaying means, and the second controlling means executes the change of the position displaying a second subject to be controlled on the displaying means. And the third controlling means executes the selection or the decision of information indicating by the first or second subject to be controlled on the displaying means. And the sliding key has a rim part whose diameter is larger than that of the opening part, the sliding key is adhered to the elastic sheet at the rim part, and a space is formed on a part of the rear surface of the surrounding key, and about the edge part of the rim part of the sliding key is disposed in the space.

According to the present invention, in the third and fourth aspects, a magnet is disposed in the sliding key, and the sensors detect the moved direction and the amount of the movement of the sliding key on the XY plane based on the change of the magnetic flux density from the magnet corresponding to the movement of the sliding key. And the sliding key provides a concave part on a part of the surface where the sliding key is adhered to the elastic sheet, and the sliding key is adhered to the elastic sheet by disposing the magnet in the concave part, and the magnet is sealed in the sliding key. Or guides being possible to be recognized optically are disposed on designated positions on the elastic sheet, and the sensors detect the moved direction and the amount of the movement of the sliding key on the XY plane by reading the movements of the guides optically corresponding to the movement of the sliding key. Or a coil is disposed in the sliding key, and the sensors detect the moved direction and the amount of the movement of the sliding key on the XY plane based on the electromotive force generated by the electromagnetic induction by the movement of the sliding key in the magnetic field of designated power formed at the surrounding part of the coil.

According to the present invention, in the third and fourth aspects, the mobile terminal, further provides a bellows having a ring shape formed in the elastic sheet outside the position where the sliding key is adhered to the elastic sheet. And the mobile terminal, further provides at least one of projections supporting the sliding key on the rear surface of the elastic sheet. And the mobile terminal, further provides a concave part formed on the front surface of the sliding key. And the mobile terminal, further provides a nonskid component disposed on the front surface of the sliding key. And the mobile terminal, further provides one or more projections formed on the front surface of the sliding key. And a group of keys except the sliding key is also formed on the front surface of the elastic sheet in a unified state.

According to the present invention, at the inputting device and the mobile terminal, a sliding key is fixed tightly (adhered) on an elastic sheet. And the sliding key is moved on a plane being almost parallel to the front surface of a cabinet of the mobile terminal. With this, a structure, in which control corresponding to the moved direction and the amount of the movement of the sliding key is possible, is realized by a structure in which a part sticking out of the cabinet does not exist or the part sticking out of the cabinet is as small as possible even if the part sticking out of the cabinet exists. Therefore, it becomes possible that a subject to be controlled displaying on a display is moved corresponding to the moved direction and the amount of the movement of the sliding key. And since the sliding key is fixed tightly on the elastic sheet, it is not necessary to form a hole in the elastic sheet, therefore, the waterproof and the dustproof can be obtained. Moreover, the sliding key is moved by utilizing the stretch and the contract of a bellows formed in the elastic sheet, its structure can be simple. Therefore, the number of components in the inputting device is decreased and the inputting device is made to be small and thin. And its manufacturing man hour can be decreased. Furthermore, by forming a concave part, a convex part, or a nonskid part on the front surface of the sliding key, its operation ability can be increased.

BRIEF DESCRIPTION OF THE DRAWINGS

The objects and features of the present invention will become more apparent from the consideration of the following detailed description taken in conjunction with the accompanying drawings in which:

FIG. 1 is a sectional view showing the structure of an inputting device at a first embodiment of the present invention;

FIG. 2 is the structure of a metal dome shown in FIG. 1;

FIG. 3 is diagrams showing a control system of the inputting device at the first embodiment of the present invention;

FIG. 4 is a sectional view showing the structure of a first modified example of the inputting device at the first embodiment of the present invention;

FIG. 5 is a sectional view showing the structure of a second modified example of the inputting device at the first embodiment of the present invention;

FIG. 6 is a sectional view showing the structure of an inputting device at a second embodiment of the present invention;

FIG. 7 is a sectional view showing the structure of an inputting device at a third embodiment of the present invention;

FIG. 12 is a sectional view showing the structure of an inputting device at a sixth embodiment of the present invention;

FIG. 13 is a plane view showing the part of a center key and a surrounding key shown in FIG. 12;

FIG. 15 is diagrams showing a state that the center key was slid at the sixth embodiment of the present invention;

FIG. 18 is a plane view showing the structure of a mobile communication terminal used an inputting device at an eighth embodiment of the present invention;

FIG. 23 is a sectional view showing the structure of the inputting device shown in FIG. 21 at a state that a center key was slid;

FIG. 24 is a diagram showing a state that a subject to be controlled was moved on a display shown in FIG. 21;

DESCRIPTION OF THE PREFERRED EMBODIMENTS

Figure 8:
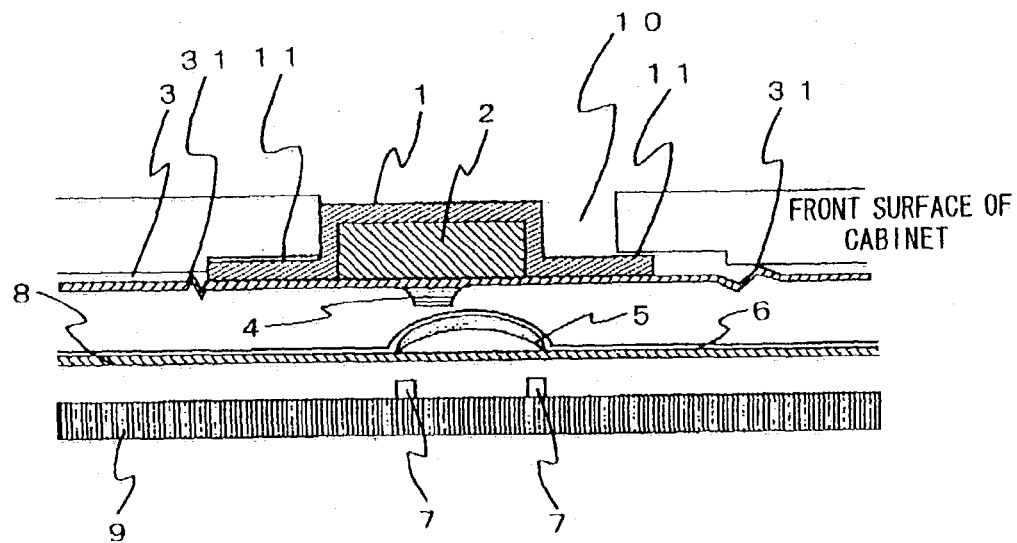
FIG. 8 is a sectional view showing a state that a center key was slid at the third embodiment of the present invention.

Referring now to the drawings, embodiments of the present invention are explained in detail. At the explanation of the embodiments of the present invention, the position of the center key in a no-load state is defined as the origin.

Referring to the drawings, an inputting device at a first embodiment of the present invention is explained.

FIG. 1 is a sectional view showing the structure of the inputting device at the first embodiment of the present invention. This inputting device is a user interface (UI), which a user operates to move a subject to be controlled on a display in an arbitrary direction. As shown in FIG. 1, the inputting device provides a center key 1, a magnet 2, a rubber sheet 3, a pushing component 4, a metal dome (contact switch) 5, a resin sheet 6, Hall elements 7, a first printed circuit board (PCB) 8, a second PCB 9, and an opening part 10.

The center key 1 is a component by which a user executes an input operation. And the user moves a subject to be controlled on a display by sliding the center key 1 in an about parallel direction to the surface of the cabinet. And a character or an image being designated by the subject to be controlled is selected or decided, by pushing the center key 1.

The magnet 2 is disposed in a concave part 1a formed in the center key 1 on the surface where the center key 1 is adhered to the rubber sheet 3. The rubber sheet 3 is a sheet shaped component made of a material having a large elastic limit, for example, silicone rubber. And the center key 1 is adhered to the surface of the rubber sheet 3 facing the cabinet at the designated position by making the origin as the center. And the magnet 2 is sealed in the concave part 1a by adhering the center key 1 to the rubber sheet 3. The edge parts of the rubber sheet 3 are contacted with the inside part of the cabinet, and the rubber sheet 3 is contacted tightly with the cabinet at these edge parts.

The pushing component 4 is adhered to the rubber sheet 3 at the opposite position of the center key 1, and is formed by a material, which is harder than the rubber sheet 3 and whose friction factor is smaller than the rubber sheet 3.

The metal dome 5 is a switch to detect that the center key 1 was pushed, in the inside direction of the cabinet and is disposed on the first PCB 8 at the position facing the pushing component 4 on the rubber sheet 3. The resin sheet 6 is formed on the first PCB 8 by covering the metal dome 5 at the position facing the rubber sheet 3, and covers the metal dome 5 completely.

The Hall elements 7 are sensors to detect the magnetic flux density from the magnet 2, and at least two Hall elements 7 are disposed at the respective designated positions on the surface of the second PCB 9 facing the first PCB 8. The opening part 10 is formed in the cabinet and has an about circle shape, and limits the sliding amount of the center key 1 disposed at the center of the opening part 10 as its initial state. That is, when the center key 1 was slid until the center key 1 hit the end of the opening part 10, the center key 1 becomes a state that the center key 1 was slid at the maximum.

Next, the structure of the metal dome 5 is explained. FIG. 2 is the structure of the metal dome 5 shown in FIG. 1. In FIG. 2, (a) shows a sectional view of the metal dome 5, (b) shows a perspective view of the metal dome 5, and (c) shows a state that the metal dome 5 was pushed. As shown in FIG. 2, the metal dome 5 has the structure that a dome shaped conductive plate 5a is combined with a wiring pattern 5b formed on the first PCB 8. And the metal dome 5 is disposed at the position corresponding to the origin of the center key 1. As shown in FIG. 2 (c), when the center key 1 was pushed and the pushing component 4 worked to give the force to the conductive plate 5a in the direction of the first PCB 8, the center part of the conductive plate 5a touched the wiring pattern 5b by that the dome shaped conductive plate 5a was deformed. With this, it is detected that the center key 1 was pushed.

In this, the conductive plate 5a is deformed sharply at the time when the pushing force becomes higher than a designated value, therefore, the user can recognize that the inputting operation is accepted by its click feeling. That is, the metal dome 5 provides a click detecting function.

FIG. 3 is diagrams showing a control system of the inputting device at the first embodiment of the present invention. In FIG. 3 (a), the disposition of the Hall elements 7 is shown, in FIG. 3 (b), the structure of the control system that controls the movement of a subject to be controlled is shown, and in FIG. 3 (c), a case that the center key 1 was slid is shown.

Referring to FIG. 3, the control system of, the inputting device at the first embodiment of the present invention is explained. That is, based on the change of the position of the center key 1 by its sliding movement, a method, which makes a subject to be controlled such as a pointer move, is explained.

As shown in FIG. 3 (a), a case in which four Hall elements 7a, 7b, 7c, and 7d are disposed on the second PCB 9 is explained. As shown in FIG. 3 (b), the movement of the subject to be controlled is controlled by the metal dome 5, the Hall elements 7a, 7b, 7c, and 7d, and a calculating section 101, a moving control command generating section 102, and a controller 103.

The calculating section 101 calculates the moved direction and the amount of the movement of the magnet 2 by making the origin as the reference, based on the magnetic flux density measured at the Hall elements 7a, 7b, 7c, and 7d. This calculation can be executed by an existing method.

The moving control command generating section 102 generates the moving control command to the subject to be controlled based on the moved direction and the amount of the movement of the magnet 2 from the origin calculated at the calculating section 101. That is, the moving control command generating section 102 generates a command, that makes the subject to be controlled on the display move in the direction corresponding to the moved direction of the magnet 2 with the speed corresponding to the amount of the movement of the magnet 2.

The controller 103 controls each of the sections in the inputting device, and makes the subject to be controlled on the display move based on the generated moving control command. That is, the controller 103 changes the position of the subject to be controlled on the display. Further, the controller 103 processes the selection or the decision of the information pointed by the subject to be controlled on the display, when the metal dome 5 was pushed and became the conductive state.

By providing the control system mentioned above, the subject to be controlled such as a pointer can be moved on the display based on the changes of the direction and the amount of movement of the magnet 2 in the center key 1.

As shown in FIG. 3 (c), when the center key 1 was slid, the magnet 2 in the center key 1 was also moved, therefore, the magnetic flux density detected by the Hall elements 7a, 7b, 7c, and 7d was also changed. Consequently, the calculating section 101 can calculate the moved direction and the amount of the movement of the center key 1, based on the signals of the changes of the magnetic flux density detected by the Hall elements 7a, 7b, 7c, and 7d. With this, the subject to be controlled on the display can be moved based on the moved direction and the amount of the movement of the center key 1.

In this, it is possible that the calculating section 101 calculates only the moved direction of the center key 1 based on the signals from the Hall elements 7. In this case, the moving control command generating section 102 generates the moving control command to the subject to be controlled, based on the moved direction of the magnet 2 from the origin. That is, the moving control command generating section 102 generates a command that makes the subject to be controlled on the display move in the direction corresponding to the moved direction of the magnet 2. This operation can be used, when it is required that only the moved direction is used. For example, as the subject to be controlled, a cursor is used, and the user checks the menu in the mobile communication terminal.

The structure of the control system shown in FIG. 3 (b) at the first embodiment of the present invention can be applied to the other embodiments of the present invention.

Next, the operation of the inputting device at the first embodiment of the present invention is explained. When a user slid the center key 1 in an arbitrary direction, the rubber sheet 3 stretches by generating the elastic deformation. And the pushing component 4 slides on the resin sheet 6 disposed on the metal dome 5 in a state that the pushing component 4 contacts with the resin sheet 6. At this time, since the metal dome 5 is covered with the resin sheet 6, the pushing component 4 is not caught by the edge of the metal dome 5. The pushing component 4 is formed by a material, which is harder than the rubber sheet 3 and whose friction factor is smaller than the rubber sheet 3, therefore, the pushing component 4 slides smoothly on the resin sheet 6. The center key 1 can be moved until the center key 1 hits the wall of the opening part 10.

When the center key 1 is moved, the magnet 2 sealed in the center key 1 is also moved with the center key 1. Therefore, the subject to be controlled on the display is moved based on the moved direction and the amount of the movement of the magnet 2 from the origin, by the operation of the control system mentioned above.

When the user stops the sliding operation of the center key 1 and releases the center key 1, the center key 1 returns to the origin automatically by the elasticity of the rubber sheet 3.

In this, there is a possibility that a user pushes the center key 1 by mistake while the user is sliding the center key 1. By considering this, in case that the amount of the movement of the center key 1 from the origin is larger than a designated value in the almost parallel direction to the surface of the cabinet, it is desirable that the controller 103 ignores the operation that the metal dome 5 becomes a conductive state.

FIG. 4 is a sectional view showing the structure of a first modified example of the inputting device at the first embodiment of the present invention. Referring to FIG. 4, the structure of the first modified example of the inputting device at the first embodiment of the present invention is explained.

As shown in FIG. 4, the inputting device does not provide the metal dome 5, the resin sheet 6, and the first PCB 8. And the pushing component 4 slides on the Hall elements 7 disposed on the second PCB 9.

In this structure, the click detecting function by the metal dome 5 is not provided. However, the distance between the magnet 2 and the Hall elements 7 becomes shorter than that at the first embodiment, therefore, the detecting accuracy of the moved direction and the amount of the movement of the center key 1 can be increased. Further, in this structure, the inputting device can be made to be smaller and thinner, because the metal dome 5 is not provided.

FIG. 5 is a sectional view showing the structure of a second modified example of the inputting device at the first embodiment of the present invention. Referring to FIG. 5, the structure of the second modified example of the inputting device at the first embodiment of the present invention is explained.

As shown in FIG. 5, the magnet 2 is disposed in a concave part 1b formed from the upper surface of the center key 1, and a lid part 1c is disposed on the magnet 2 and the edge part of the center key 1. With this structure, the magnet 2 is sealed in the center key 1.

By this structure, the area, which the center key 1 contacts with the rubber sheet 3, can be made to be large. Therefore, the adhering strength of the center key 1 to the rubber sheet 3 can be increased. Further, by making the material of the lid part 1c different from that of the center key 1, the color feeling and the touch feeling of the center key 1 can be changed, and the degree of freedom at its cosmetic designing can be increased.

The first and second modified examples shown in FIGS. 4 and 5 at the first embodiment of the present invention can be applied to the other embodiments of the present invention.

At the structures of the first embodiment of the present invention mentioned above, the first PCB 8 and the second PCB 9 are always isolated from the outside of the cabinet by using the rubber sheet 3. Therefore, the effects of the waterproof and the dustproof can be obtained regardless of the position of the center key 1.

As mentioned above, according to the inputting device at the first embodiment of the present invention, the moving control command to the subject to be controlled is generated, based on the position of the magnet 2 sealed in the center key 1. Therefore, the moving control command can be generated in an arbitrary direction on the display.

Moreover, according to the inputting device at the first embodiment of the present invention, the structure is a simple structure, in which the center key 1 is adhered to the rubber sheet 3. Therefore, the number of components is decreased and its assembling man hour is also decreased, and the inputting device can be made to be small and thin.

Furthermore, according to the inputting device at the first embodiment of the present invention, the structure of the inputting device can be made to be a structure, in which a part sticking out of the surface of the cabinet does not exist or the part sticking out of the surface of the cabinet is made to be as small as possible even if it has the sticking out part. And the structure can provide the waterproof and the dustproof.

Next, an inputting device at a second embodiment of the present invention is explained. FIG. 6 is a sectional view showing the structure of the inputting device at the second embodiment of the present invention. As shown in FIG. 6, at the second embodiment of the present invention, the center key 1 provides a skirt part 11 having an about ring shape, and the cabinet has a space in which the skirt part 11 of the center key 1 slides. And the other parts are equal to those at the first embodiment.

The skirt part 11 is formed in the center key 1 at the side adhering to the rubber sheet 3, and increases the area adhering to the rubber sheet 3, and prevents the center key 1 from dropping out of the cabinet. The maximum diameter of the skirt part 11 is larger than the diameter of the opening part 10, therefore, even when the center key 1 is slid to its maximum limit (the center key 1 is slid until the center key 1 hits the wall of the opening part 10), the rubber sheet 3 is not exposed to the outside of the cabinet. This size of the skirt part 11 is desirable. The rim part of the skirt part 11 is disposed in the space between the cabinet and the rubber sheet 3, therefore, even when the center key 1 is separated from the rubber sheet 3 by that the adhesive between them is peeled off, the center key 1 is not dropped from the cabinet.

Further, by providing the skirt part 11, the rubber sheet 3 can be prevented from damaging by the influence of foreign articles, therefore, the waterproof and the dustproof can be kept in a good state.

As mentioned above, according to the inputting device at the second embodiment of the present invention, by providing the skirt part 11 in the center key 1, the center key 1 can be prevented from dropping out of the cabinet, moreover, the rubber sheet 3 can be prevented from damaging, furthermore, the waterproof and the dustproof can be obtained.

Next, an inputting device at a third embodiment of the present invention is explained. FIG. 7 is a sectional view showing the structure of the inputting device at the third embodiment of the present invention. As shown in FIG. 7, at the third embodiment of the present invention, a bellows 31 is provided in the rubber sheet 3 in a state that the bellows 31 stretches and contracts freely. And the other parts are equal to those at the second embodiment. In this, the bellows 31 is formed in the rubber sheet 3 at the outside position of the adhering area with the center key 1 in a ring state.

FIG. 8 is a sectional view showing a state that the center key 1 was slid at the third embodiment of the present invention. As shown in FIG. 8, a part of the bellows 31 in the slid direction of the center key 1 was contracted and a part of the bellows 31 in the opposite direction was stretched. Consequently, the force making the center key 1 return to the origin works by that bellows 31 stretches and contracts.

Furthermore, the center key 1 can be slid largely because the bellows 31 stretches and contracts.

In case that the bellows 31 is not provided, the force making the center key 1 return to the origin must be made to be a large value when the amount of the slide is large. Therefore, its operation ability may be decreased.

However, at the third embodiment of the present invention, at the time when the center key 1 is slid, the operating load can be decreased by providing the bellows 31. Therefore, even when the center key 1 is slid largely, the good operation ability can be obtained.

Figure 9:
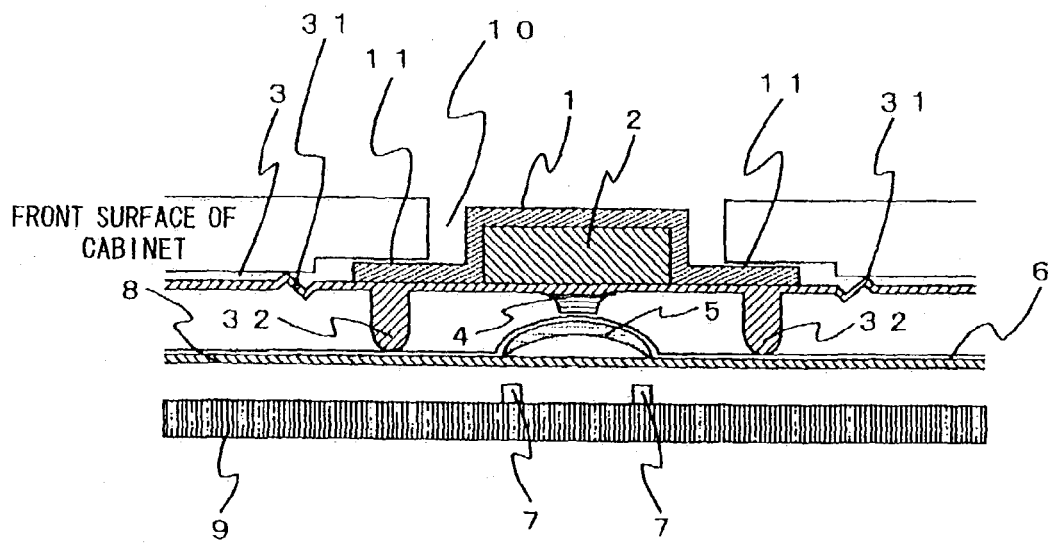
FIG. 9 is a sectional view showing the structure of an inputting device at a fourth embodiment of the present invention.

Next, an inputting device at a fourth embodiment of the present invention is explained. FIG. 9 is a sectional view showing the structure of the inputting device at the fourth embodiment of the present invention. As shown in FIG. 9, at the fourth embodiment of the present invention, a convex part 32 is provided in the rubber sheet 3 at the position facing the first PCB 8. And the other parts are equal to those at the third embodiment.

The convex part 32 has almost the same height as the gap between the rubber sheet 3 and the first PCB 8 has, and is disposed at the position outside the metal dome 5, in order not to prevent the center key 1 from sliding smoothly.

The convex part 32 can be formed with the rubber sheet 3 by unifying them, or can be adhered to the rubber sheet 3. However, the material of the convex part 32 is desirable to be softer than that of the pushing component 4. Furthermore, the convex part 32 can be formed in a ring shape, or the convex parts 32 can be formed by disposing plural projections.

In case that a user slides the center key 1, the convex part 32 slides on the resin sheet 6 by supporting the center key 1. Therefore, the convex part 32 prevents the metal dome 5 from being made to be a conductive state by an operation that the user pushes the center key 1 by mistake.

Figure 10:
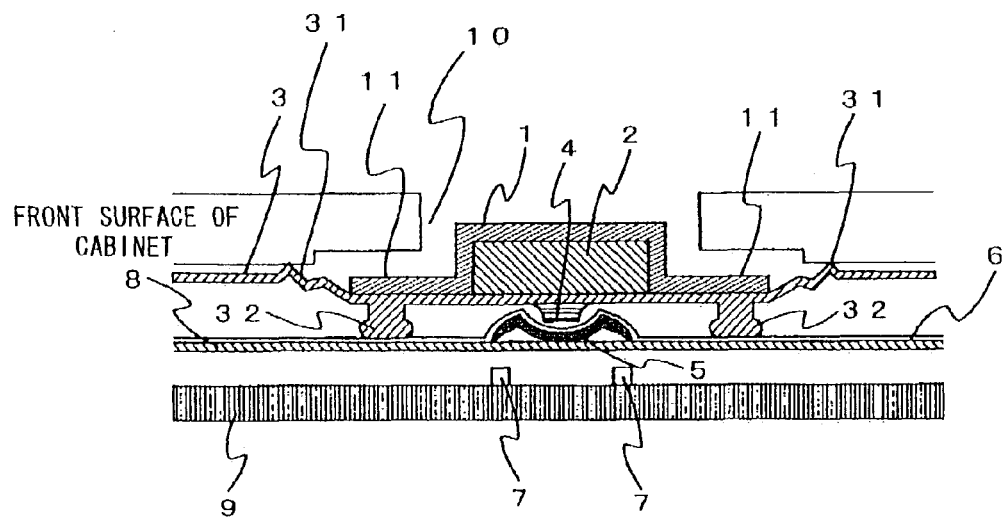
FIG. 10 is a sectional view showing a state that a center key was pushed at the fourth embodiment of the present invention.

FIG. 10 is a sectional view showing a state that the center key 1 was pushed at the fourth embodiment of the present invention. As shown in FIG. 10, when a user pushed the center key 1, the convex part 32 was deformed by that the convex part 32 was pressed by the center key 1 and the first PCB 8. With this, the metal dome 5 can be worked.

In case that the convex part 32 is not provided, the center key 1 must be supported by the elasticity of the rubber sheet 3. Therefore, when the elasticity was decreased by deteriorating the rubber sheet 3, the force making the center key 1 return to the origin is decreased. Further, a possibility, which the metal dome 5 is made to be in a conductive state by mistake by weakening the force supporting the center key 1, may occur. At the fourth embodiment of the present invention, an error operation caused by the deterioration of the rubber sheet 3 can be prevented by supporting the center key 1 by the convex part 32.

Figure 11:
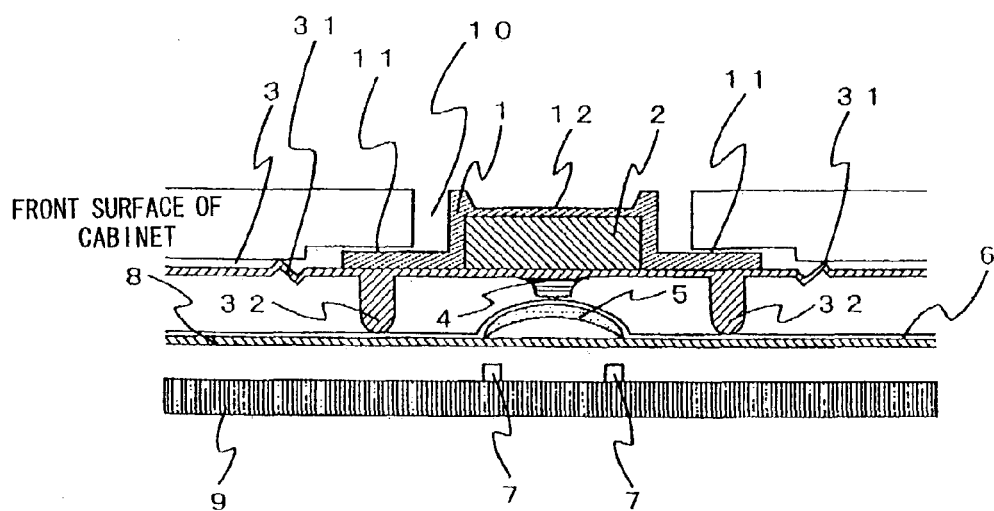
FIG. 11 is a sectional view showing the structure of an inputting device at a fifth embodiment of the present invention.

Next, an inputting device at a fifth embodiment of the present invention is explained. FIG. 11 is a sectional view showing the structure of the inputting device at the fifth embodiment of the present invention. As shown in FIG. 11, at the fifth embodiment of the present invention, a concave part 12 is provided in the upper surface of the center key 1. And the other parts are equal to those at the fourth embodiment.

At the inputting device of the fifth embodiment of the present invention, since the concave part 12 is provided in the center key 1, a finger of the user can be caught by the edge of the concave part 12, and the user can easily apply the force in the sliding direction of the center key 1. With this, since the user can easily apply the force in the sliding direction, it can be prevented that the user pushes the center key 1 by mistake while the user is sliding the center key 1.

As mentioned above, according to the inputting device at the fifth embodiment of the present invention, the operation ability of the center key 1 can be increased. Further, an error operation caused by pushing the center key 1 by mistake can be decreased. In this, the shape of the concave part 12 is not limited to the shape shown in FIG. 11, a smooth curved surface can be used as the shape of the concave part 12.

Next, an inputting device at a sixth embodiment of the present invention is explained. FIG. 12 is a sectional view showing the structure of the inputting device at the sixth embodiment of the present invention. As shown in FIG. 12, at the sixth embodiment of the present invention, a surrounding key 20 is provided at the position surrounding the center key 1. And the other parts are equal to those at the fifth embodiment. In FIG. 12, pushing components 4a and 4b, metal domes 5z and 5y, and a thin part 201, which are provided for the surrounding key 20, are explained later.

FIG. 13 is a plane view showing the part of the center key 1 and the surrounding key 20 shown in FIG. 12. As shown in FIG. 13, the surrounding key 20 has an about ring shape looking from the front. And direction indicating sections 20a, 20b, 20c, and 20d are formed in the surrounding key 20 at the respective positions in the length directions and the width directions corresponding to the directions on the display. The surrounding key 20 is adhered to the cabinet side surface of the rubber sheet 3 at the designated position:

Pushing components 4a, 4b, 4c, and 4d are formed on the rear surface of the rubber sheet 3 at the positions corresponding to the direction indicating sections 20a to 20d. The pushing components 4a to 4d can be formed by unifying with the rubber sheet 3, or can be formed by adhering to the rubber sheet 3 by making the pushing components 4a to 4d separately.

Metal domes 5z, 5y, 5x, and 5w are formed on the first PCB 8 at a state that the metal domes 5z to 5w are covered with the resin sheet 6 at the positions corresponding to the pushing components 4a to 4d. That is, the surrounding key 20 is a pushing key.

As shown in FIG. 12, the opening part 10 is formed between the center key 1 and the surrounding key 20. Further, a thin part 201 is formed on the outside surface of each of the direction indicating sections 20a to 20d, and the user can easily operate the center key 1 and the direction indicating sections 20a to 20d in the surrounding key 20.

Figure 14:
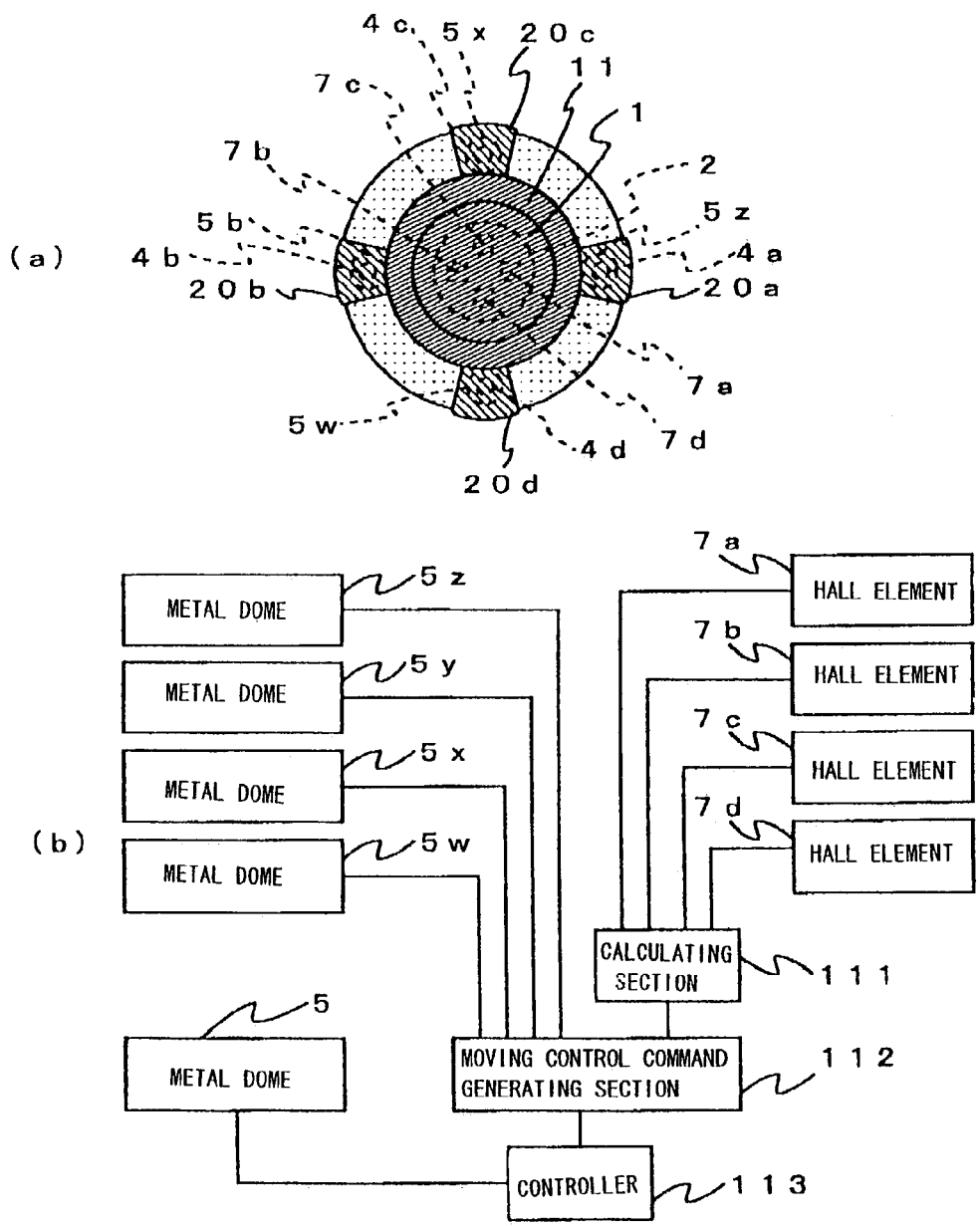
FIG. 14 is diagrams showing the control system of the inputting device at the sixth embodiment of the present invention.

Next, the control system of the inputting device at the sixth embodiment of the present invention is explained. FIG. 14 is diagrams showing the control system of the inputting device at the sixth embodiment of the present invention. In FIG. 14 (a), the disposition of the Hall elements 7 is shown, and in FIG. 14 (b), the structure of the control system that controls the movement of a subject to be controlled is shown.

Referring to FIG. 14, the control system of the inputting device at the sixth embodiment of the present invention is explained. That is, based on the change of the position of the center key 1 by its sliding movement, a method, which makes a subject to be controlled such as a pointer move, is explained.

As shown in FIG. 14 (a), a case in which four Hall elements 7a, 7b, 7c, and 7d are provided on the second PCB 9 is explained. As shown in FIG. 14 (b), the movement of the subject to be controlled is controlled by the metal dome 5, the Hall elements 7a to 7d, the metal domes 5z to 5w disposed corresponding to the direction indicating sections 20a to 20d, a calculating section 111, a moving control command generating section 112, and a controller 113.

The function of the calculating section 111 is the same as that of the calculating section 101 at the first embodiment of the present invention. The function of the controller 113 is the same as that of the controller 103 at the first embodiment of the present invention.

The moving control command generating section 112 generates the moving control command to the subject to be controlled based on the moved direction and the amount of the movement of the magnet 2 from the origin calculated at the calculating section 111. That is, the moving control command generating section 112 generates a command that makes the subject to be controlled on the display move in the direction corresponding to the moved direction of the magnet 2 with the speed corresponding to the amount of the movement of the magnet 2.

In case that each of the direction indicating sections 20a to 20d was pushed, the moving control command generating section 112 generates a command that makes the subject to be controlled such as a cursor move in the direction corresponding to the pushed one of the direction indicating sections 20a to 20d.

The controller 113 controls each of the sections in the inputting device, and makes the subject to be controlled on the display move based on the generated moving control command.

That is, the controller 103 changes the position of the subject to be controlled on the display. Further, the controller 103 processes the selection or the decision of the information pointed by the subject to be controlled on the display, when the metal dome 5 is pushed and becomes a conductive state.

By providing the control system mentioned above, the subject to be controlled such as a cursor can be moved on the display based on the changes of the direction and the amount of movement of the magnet 2 in the center key 1. Further, the subject to be controlled can be moved in the direction corresponding to the pushed direction indicating section.

FIG. 15 is diagrams showing a state that the center key 1 was slid at the sixth embodiment of the present invention. FIG. 15 (a) shows a plane view of the part of the center key 1 and the surrounding key 20 at the time when the center key 1 was slid. And FIG. 15 (b) shows a sectional view of the inputting device at the time when one of the direction indicating sections 20a to 20d was pushed at the sixth embodiment of the present invention.

As shown in FIG. 15 (a), when the center key 1 was slid, the magnet 2 in the center key 1 was also moved, therefore, the magnetic flux density detected by the Hall elements 7a, 7b, 7c, and 7d was also changed. Consequently, the calculating section 111 can calculate the moved direction and the amount of the movement of the center key 1, based on the signals of the changes of the magnetic flux density detected by the Hall elements 7a, 7b, 7c, and 7d. With this, the controller 113 can move the subject to be controlled on the display based on the moved direction and the amount of the movement of the center key 1.

As shown in FIG. 15 (b), in case that one of the direction indicating sections 20a to 20d was pushed, the corresponding one of the pushing components 4a to 4d makes the corresponding one of the metal domes 5z to 5w a conductive state. Therefore, the moving control command generating section 112 generates a command that makes the subject to be controlled move in the direction corresponding to the pushed direction indicating section. With this, the controller 113 can move the subject to be controlled in the direction that one of the direction indicating sections in the surrounding key 20 was pushed. In this, in FIG. 15 (b), a state that the direction indicating section 20a was pushed is shown.

The center key 1 moves the subject to be controlled such as a cursor corresponding to the amount of the slide. However, in case that the subject to be controlled is moved by using the surrounding key 20, it is possible that the subject to be controlled is moved by a designated amount at each time when one of the direction indicating sections is pushed. Therefore, in case that it is not necessary to move the subject to be moved in an arbitrary direction with an arbitrary speed or in an arbitrary direction, its operation ability can be increased by using the surrounding key 20. That is, in case that a subject to be controlled is moved in one of the length directions and the width directions, the surrounding key 20 can be used effectively.

For example, when the subject to be controlled is a cursor on a text screen, in many cases, it is not necessary that the cursor is moved in an arbitrary direction with an arbitrary speed. In this case, the user can surely move the cursor by the desiring number of characters, by making the cursor move using the surrounding key 20.

At the explanation mentioned above, by using the center key 1 and the surrounding key 20, the moving control for the one subject to be controlled is explained. However, it is possible that one function is allocated to the center key 1 and other function is allocated to the surrounding key 20. For example, the moving control for a pointer is executed by the center key 1 and the moving control for a cursor is executed by the surrounding key 20, this operation is possible. Further, it is possible that an operation except the moving control is allocated to the surrounding key 20. For example, a function showing a menu in the mobile communication terminal can be allocated to one of the direction indicating sections 20a to 20d in the surrounding key 20.

Figure 16:
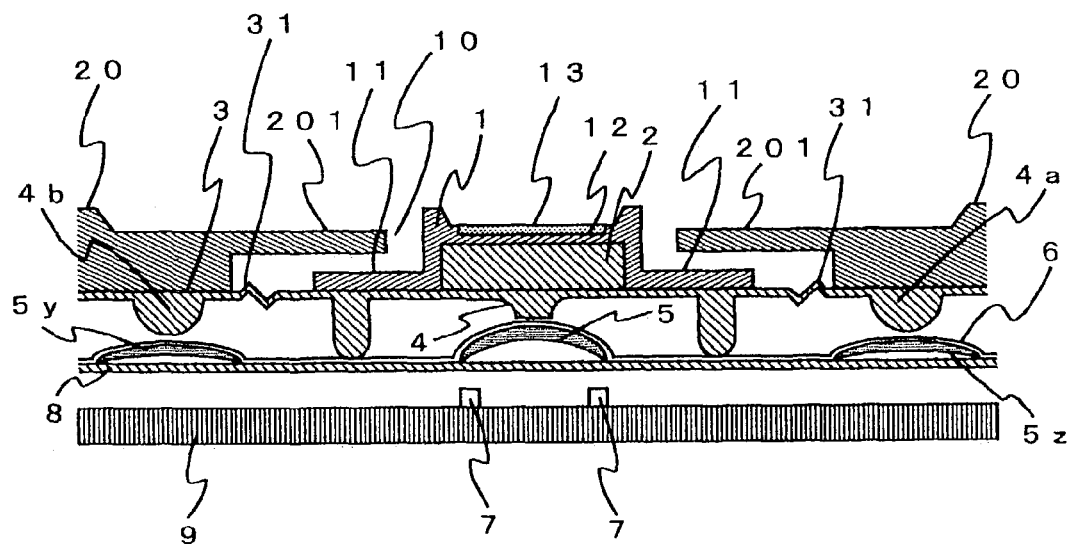
FIG. 16 is a sectional view showing the structure of an inputting device at a seventh embodiment of the present invention.

Next, an inputting device at a seventh embodiment of the present invention is explained. FIG. 16 is a sectional view showing the structure of the inputting device at the seventh embodiment of the present invention. As shown in FIG. 16, at the seventh embodiment of the present invention, a nonskid component 13 is provided at the concave part 12 in the center key 1. And the other parts are equal to those at the sixth embodiment.

The nonskid component 13 is formed by a material whose friction factor is larger than that of the center key 1, and is fixed in the concave part 12 in the center key 1 by adhering or embedding. In this, the nonskid component 13 can be formed by the same material of the center key 1, in this case, the surface of the nonskid component 13 is made to be coarse and the friction factor is made to be larger than that of the center key 1.

As mentioned above, according to the inputting device at the seventh embodiment of the present invention, the nonskid component 13 is formed at the upper surface of the center key 1, therefore, when a user slides the center key 1, slipping the finger of the user can be prevented. Consequently, the operation ability of the center key 1 can be increased and an error operation can be decreased. Further, by using a different material from the center key 1 for the nonskid component 13, the color feeling and the touch feeling of the center key 1 can be changed.

And as shown in FIG. 16, when the nonskid component 13 is embedded in the concave part 12 in the center key 1, the nonskid component 13 can be prevented from scraping off at the time when the user slides the center key 1.

At the seventh embodiment of the present invention, the nonskid component 13 is disposed only in the center key 1, however, the nonskid component can be disposed on the surface of the surrounding key 20.

Figure 17:
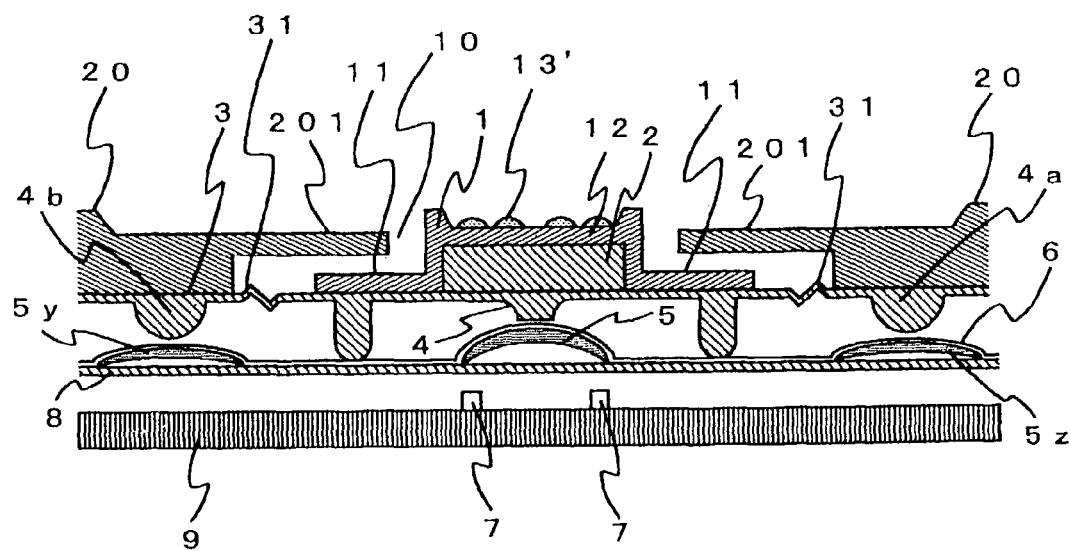
FIG. 17 is a sectional view showing the structure of a modified example of the inputting device at the seventh embodiment of the present invention.

FIG. 17 is a sectional view showing the structure of a modified example of the inputting device at the seventh embodiment of the present invention. As shown in FIG. 17, on the concave part 12 in the center key 1, convex components 13' instead of the nonskid component 13 are disposed. In this, it is possible that at least one convex component is disposed on the concave part 12 in the center key 1. In this case, when the user slides the center key 1, slipping the finger of the user is decreased and the operation ability of the center key 1 is increased and an error operation can be decreased.

As mentioned above, the operation ability can be increased and the error operation can be decreased by disposing the nonskid component 13 or the convex component(s) 13' at the concave part 12 in the center key 1. These effects can be obtained by not disposing the concave part 12. That is, the operation ability can be increased and the error operation can be decreased by disposing at least one of the concave part 12, the nonskid component 13, and the convex component(s) 13' in the center key 1.

Next, a mobile communication terminal used an inputting device at an eighth embodiment of the present invention is explained. FIG. 18 is a plane view showing the structure of the mobile communication terminal used the inputting device at the eighth embodiment of the present invention. As shown in FIG. 18, this mobile communication terminal provides a displaying section 40 and an operating section 50, and the displaying section 40 and the operating section 50 are connected with a hinge (not shown). An inputting device 500 is provided in the operating section 50. This inputting device 500 is the same one mentioned at the sixth embodiment of the present invention. The displaying section 40 provides a display 41 in which characters and images are displayed and a speaker (not shown) and so forth.

At the explanation of the mobile communication terminal at the eighth embodiment of the present invention, the reference numbers for the components are different from those used at the sixth embodiment. However, when each of the components has the same name, the component having the same has the same function regardless of the reference number. For example, the center key 1 is used at the sixth embodiment, however, at the eighth embodiment, a center key 501 is used. In this case, the center key 1 and the center key 501 have the same name, therefore, both the center keys have the same function.

Figure 19:
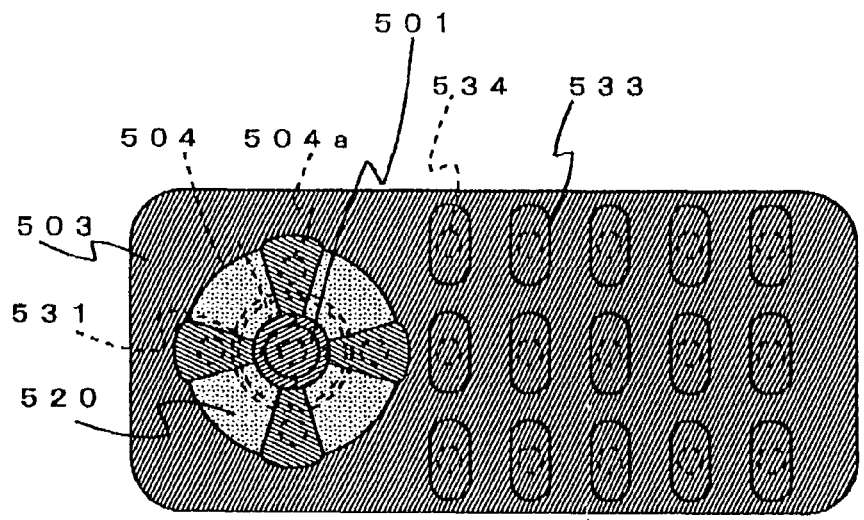
FIG. 19 is a plane view and a sectional view showing a key sheet using at an operating section shown in FIG. 18.
Figure 19:
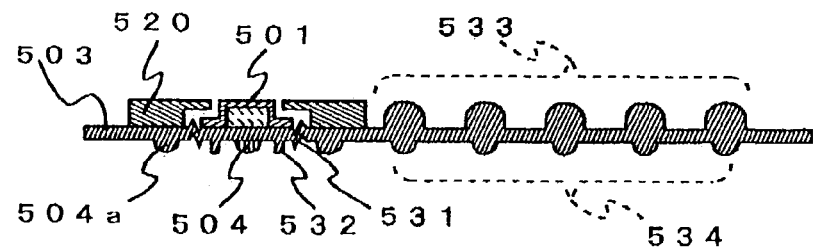

FIG. 19 is a plane view and a sectional view showing a key sheet 503 using at the operating section 50 shown in FIG. 18. The key sheet 503 has almost the same shape as the operating section 50 has looking from the front. On the front surface of the key sheet 503, the center key 501, a surrounding key 520, and a group of keys 533 are disposed. And reference numbers 504, 504a, and 534 are pushing components, and they are formed under respective keys. And the reference number 531 shows a bellows and the reference number 532 shows a convex part.

Figure 20:
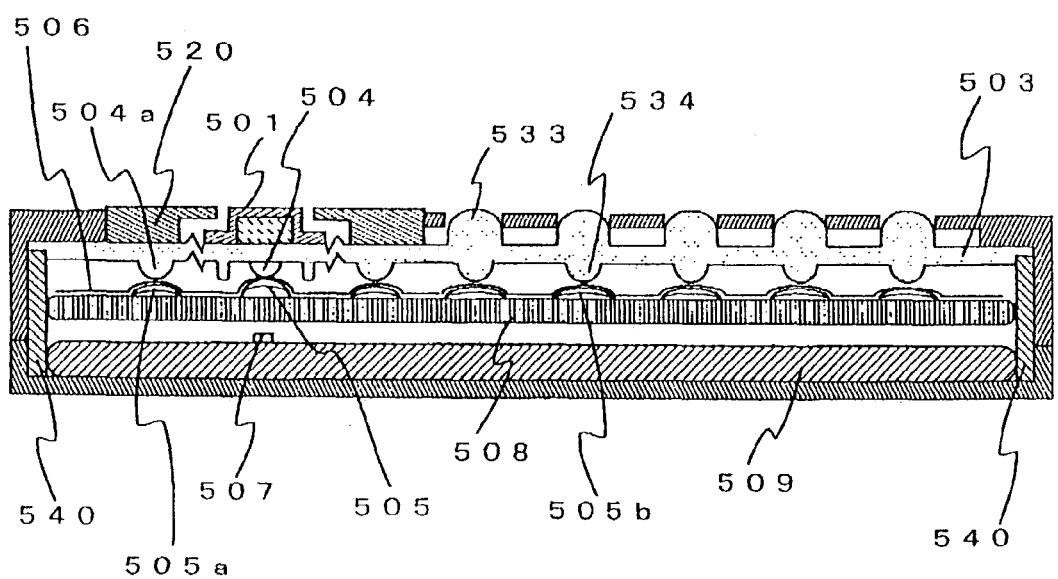
FIG. 20 is a sectional view showing the structure of the operating section shown in FIG. 18.

FIG. 20 is a sectional view showing the structure of the operating section 50 shown in FIG. 18. As shown in FIG. 20, metal domes 505, 505a, and 505b are disposed on a first PCB 508 at the positions corresponding to the respective pushing components 504, 504a, and 534. And the first PCB 508 disposed the metal domes 505, 505a, and 505b are covered with a resin sheet 506 at the position that the first PCB 508 faces a rubber sheet 503. And Hall elements 507 are disposed on a second PCB 509 at the position that the second PCB 509 faces the first PCB 508. At least the edge of the rubber sheet 503 is tightly contacted with the inside surface of the upper cabinet by that a frame component 540 presses the rubber sheet 503. The frame component 540 has a length being a little shorter than the inside length of the upper cabinet and the lower cabinet, and is disposed on the inside side surfaces of the upper cabinet and the lower cabinet. With this disposition, the frame component 540 presses the rubber sheet 503 in the front direction of the upper cabinet. With the structure mentioned above, the waterproof and the dustproof structure for not only the inputting device 500 but also all the keys of the operating section 50 can be realized. In this, at the explanation mentioned above, the pushing components 504, 504a, and 534, and the metal domes 505, 505a, and 505b were explained, however, as shown in FIGS. 19 and 20, a pushing component and a metal dome are provided for each of all keys in the group of keys 533, further, as mentioned at the sixth embodiment, each of the direction indicating sections provides a pushing component and a metal dome.

At the mobile communication terminal at the eighth embodiment of the present invention, the inputting device at the sixth embodiment of the present invention was provided. However, the mobile communication terminal can provide any of the inputting devices mentioned at the first to fifth embodiments of the present invention.

As mentioned above, according to the mobile communication terminal at the eighth embodiment of the present invention, a subject to be controlled such as a cursor can be moved in an arbitrary direction with an arbitrary speed on the display 41. Moreover, a part sticking out of the surface of the cabinet is not formed, or even if the part sticking out of the surface of the cabinet exists, the part can be made to be as small as possible. Furthermore, the waterproof and the dustproof structure can be realized. And since the number of components can be decreased, the mobile communication terminal can be small and thin, and its manufacturing can be simple.

Figure 21:
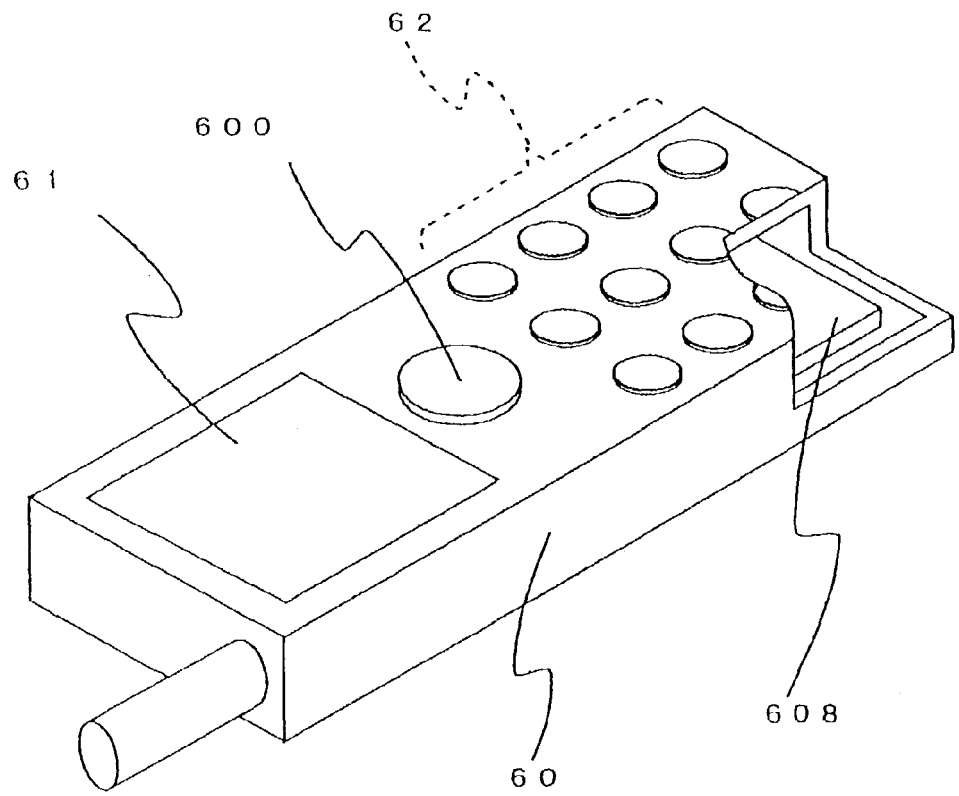
FIG. 21 is a perspective view showing the structure of a mobile communication terminal used an inputting device at a ninth embodiment of the present invention.

Next, a mobile communication terminal used an inputting device at a ninth embodiment of the present invention is explained. FIG. 21 is a perspective view showing the structure of the mobile communication terminal used the inputting device at the ninth embodiment of the present invention. In FIG. 21, in order to show the inside of the mobile communication terminal, a part of the mobile communication terminal is cut.

As shown in FIG. 21, a mobile communication terminal 60 provides a display 61, a group of keys 62, an inputting device 600, and a first PCB 608. And the first PCB 608 is shown from the cut part. Characters and images are displayed on the display 61. The group of keys 62 is the same as an existing mobile communication terminal has, for example, each of the group of keys 62 is a number key. The first PCB 608 is an electronic circuit board in which many components are mounted, and works to realize mobile communication.

Figure 22:
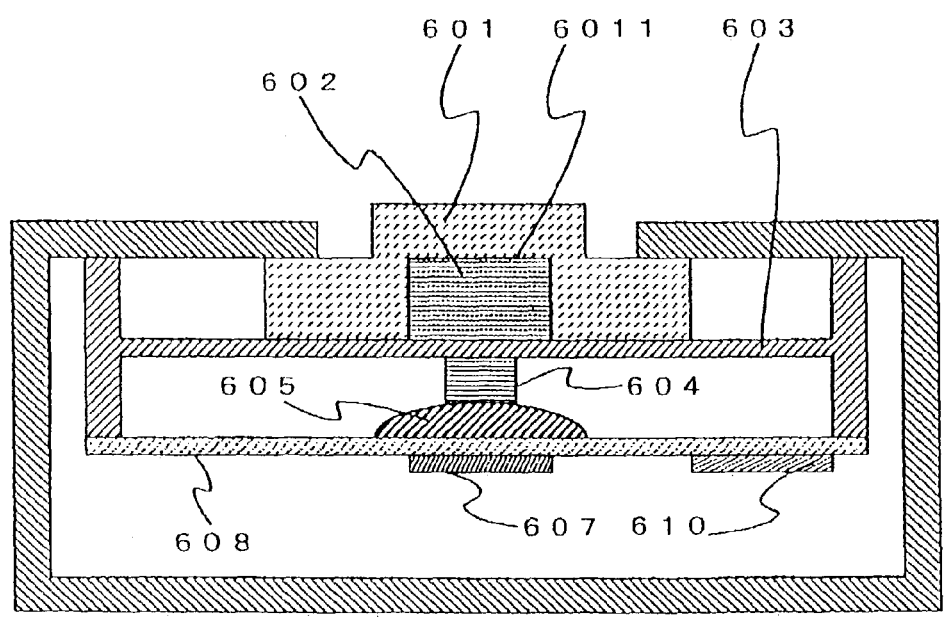
FIG. 22 is a sectional view showing the structure of an inputting device shown in FIG. 21.

FIG. 22 is a sectional view showing the structure of the inputting device 600 shown in FIG. 21. As shown in FIG. 22, the inputting device 600 provides a center key 601, a magnet 602, a rubber sheet 603, a pushing component 604, a metal dome 605, Hall elements 607, the first PCB 608, and a circuit 610 for executing calculation. At the ninth embodiment of the present invention, a second PCB is not shown.

As shown in FIG. 22, a concave part 6011 is formed in the center key 601 on the surface of the center key where the center key 601 is adhered to the rubber sheet 603, and the magnet 2 is disposed in the concave part 6011. The magnet 602 is sealed in the concave part 6011 by that the center key 601 is adhered to the rubber sheet 603.

The rubber sheet 603 is formed by a material having elasticity and flexibility or having only elasticity, and has an H shape whose upper edge is adhered to the inside surface of the cabinet. And the center key 601 and key tops (not shown) of the group of keys 62 are disposed on the rubber sheet 603 at the positions where the rubber sheet 603 faces the rear surface of the cabinet. And the pushing component 604 corresponding to the center key 601 and pushing components (not shown) corresponding to the group of keys 62 are disposed on the rear surface of the rubber sheet 603. At the ninth embodiment of the present invention, the second PCB 608 is fixed to the cabinet, and the cabinet is actually divided into the upper and lower cabinets.

The pushing component 604 is formed by a material, which is harder than the rubber sheet 603 and whose friction factor is smaller than the rubber sheet 603. The metal dome 605 is disposed on the PCB 608 at the position facing the rubber sheet 603, and the Hall elements 607 are disposed on the rear surface of the first PCB 608 at the position corresponding to the metal dome 605. And the circuit 610 is also disposed on the rear surface of the first PCB 608. The circuit 610 moves a subject to be controlled on the display 61 corresponding to the moved direction and the amount of the movement of the center key 601. That is, the circuit 610 changes the displaying position of the subject to be controlled on the display 61.

At the explanation of the ninth embodiment of the present invention, the reference numbers for the components are different from those used at the embodiments of the inputting device. However, when each of the components has the same name, the component having the same has the same function regardless of the reference number.

FIG. 23 is a sectional view showing the structure of the inputting device 600 shown in FIG. 21 at a state that the center key 601 was slid. As shown in FIG. 23, when the center key 601 was slid, the magnet 602 was also moved, and the relation of the position between the magnet 602 and the Hall elements 607 was also changed. Therefore, the magnetic flux density detected by the Hall elements 607 was changed. The circuit 610 generates a moving control command to the subject to be controlled (pointer) based on the signal by the change of the magnetic flux density.

FIG. 24 is a diagram showing a state that a subject to be controlled was moved on the display 61 shown in FIG. 21. As shown in FIG. 24, by the moving control command generated at the circuit 610, a pointer 611 (subject to be controlled) on the display 61 was moved.

As mentioned above, according to the mobile communication terminal 60 at the ninth embodiment of the present invention, the subject to be controlled on the display 61 can be moved by sliding the center key 601. The circuit 610 can generates a moving control command to the subject to be controlled based on the moved direction and the amount of the movement of the center key 601. Therefore, the subject to be controlled on the display 61 can be moved in an arbitrary direction with an arbitrary speed by operating the center key 601.

And according to the mobile communication terminal 60 at the ninth embodiment of the present invention, the magnet 602 is sealed in the center key 601, therefore, the volume of the center key 601 is not increased. Moreover, the center key 601 is adhered to the rubber sheet 603, therefore, the mobile communication terminal can be manufactured easily by disposing the center key 601 at a designated position on the rubber sheet 603. Furthermore, it is not necessary to form a hole in the rubber sheet 603, therefore, the waterproof and the dustproof can be obtained.

As mentioned above, the embodiments of the present invention are explained in detail. However, the embodiments of the present invention are suitable examples, and the present invention is not limited to the embodiments mentioned above.

For example, at the embodiments of the inputting device, the shapes of the components such as the center key 1 and the surrounding key 20, of which the inputting device is composed, are not limited to those shown in the drawings. For example, each of the shapes of the center key 1 and the surrounding key 20 can be a prism or an elliptic cylinder. And the opening part 10 is not limited to an about circle shape, any shape can be used for the opening part 10.

And at the embodiments of the inputting device, the moved direction and the amount of the movement of the center key 1 are detected by the magnet 2 and the Hall elements 7, however, the detection is not limited by the components mentioned above. For example, the change of the magnetic flux density corresponding to the sliding movement of the center key 1 can be detected by using reed switches instead of using the Hall elements 7.

Figure 25:
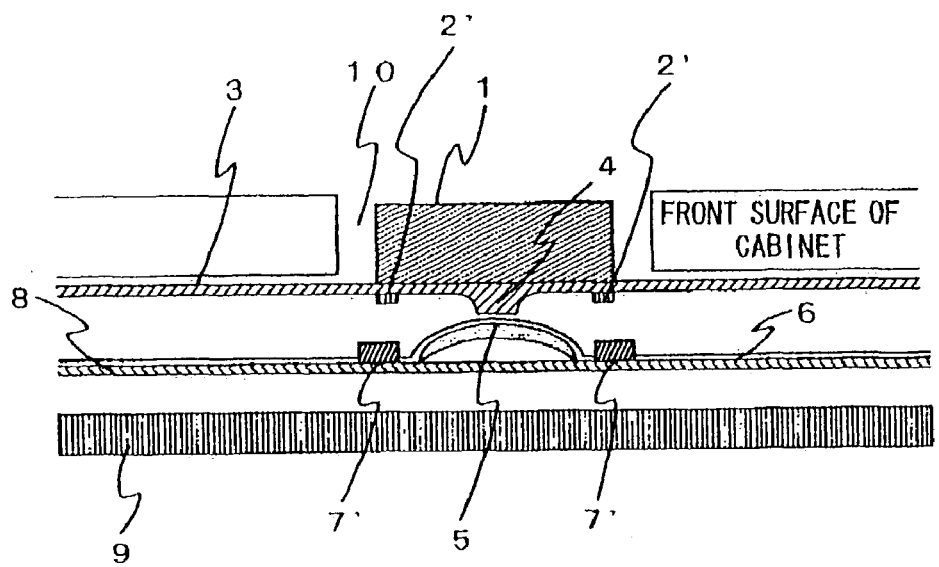
FIG. 25 is a sectional view showing the structure of an inputting device using optical devices at the present invention.

FIG. 25 is a sectional view showing the structure of an inputting device using optical devices at the present invention. As shown in FIG. 25, optical guides 2', which can be recognized optically, are disposed on the rubber sheet 3 at the positions facing the first PCB 8, and the changes of the positions of the optical guides 2' are detected by photoelectric conversion devices 7' such as CCDs and CMOSs disposed on the first PCB 8. This structure is possible.

Figure 26:
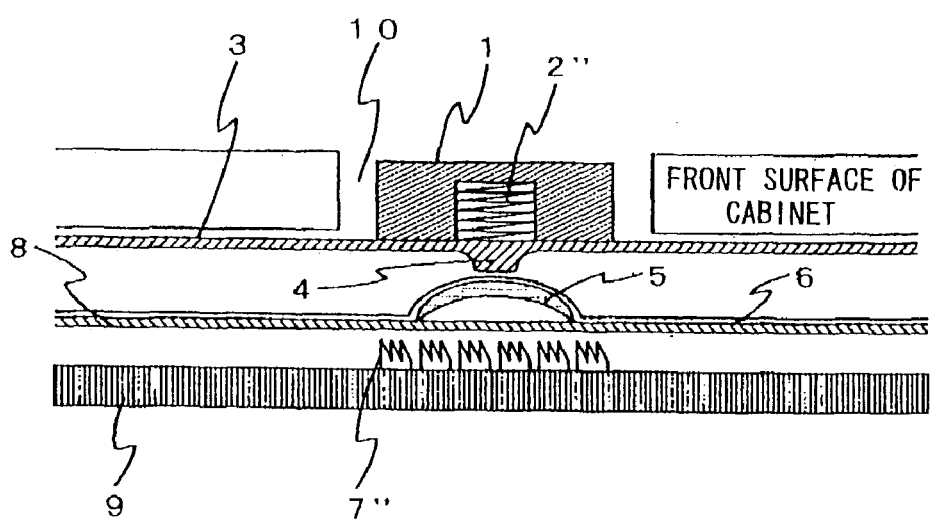
FIG. 26 is a sectional view showing the structure of an inputting device using electromagnetic induction at the present invention.

FIG. 26 is a sectional view showing the structure of an inputting device using electromagnetic induction at the present invention. As shown in FIG. 26, a coil 2" instead of the magnet 2 is disposed in the center key 1, and plural coils 7" instead of the Hall elements 7 are disposed on the second PCB 9. With this structure, the sliding movement of the center key 1 can be detected by the electromagnetic induction. This structure is also possible.

Moreover, at the embodiments of the mobile communication terminal used an inputting device, as shown in FIGS. 18 and 21, the mobile communication terminal can be a foldable type or cannot be the foldable type. In case that the mobile communication terminal is a foldable type, when a part sticking out of the upper cabinet exists, the part prevents the mobile communication terminal from folding. Therefore, the present invention can be used effectively for the foldable type mobile communication terminal.

At the embodiments of the present invention, as a mobile terminal, the mobile communication terminal is used. However, the present invention can be applied to mobile terminals such as PDAs and notebook computers. Furthermore, the present invention can be applied to not mobile terminals such as remote control units, electronic dictionaries, and ordinary PCs.

As mentioned above, according to the embodiments of the present invention, an inputting device and a mobile terminal used this inputting device, in which a subject to be controlled such as a pointer and a cursor can be formed on a display in an arbitrary direction with an arbitrary speed, are realized. Moreover, the inputting device can provide the waterproof and the dustproof. Furthermore, the inputting device is able to have a structure, which does not have a part sticking out of the surface of the cabinet or has the part sticking out of the surface of the cabinet as small as possible even if it has the sticking out part. And the structure of the inputting device can be made to be simple.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An inputting device, which is disposed in an opening of a cabinet surface, comprising:
    an elastic sheet having an outside surface disposed on an inside surface of said cabinet including said opening and across said opening;
    a sliding key that is fixed on the outside surface of said elastic sheet with at least a portion in said opening of said cabinet surface; and
    sensors that at least detect movement in a horizontal direction that is substantially parallel to said cabinet surface, of said sliding key,
    wherein guides being possible to be recognized optically are disposed on designated positions on said elastic sheet, and said sensors detect the moved direction and the amount of the horizontal movement of said sliding key by reading the movements of said guides optically corresponding to the movement of said sliding key.

2. An inputting device in accordance with claim 1, wherein:
    said sliding key has a rim part whose diameter is larger than that of said opening.

3. An inputting device in accordance with claim 2, wherein:
    said sliding key is adhered to said elastic sheet at said rim part, and
    a space is formed on a portion of the inside surface of said cabinet at a position adjacent to said opening, and
    at least a portion of said rim part of said sliding key is disposed in said space.

4. An inputting device in accordance with claim 1, further comprising:
    a first control signal generating means that generates a first control signal corresponding to at least the moved direction of said sliding key detected by said sensors, wherein:
    said first control signal executes the change of the position of a subject to be controlled on a display.

5. An inputting device, which is disposed in an opening of a cabinet surface, comprising:
    an elastic sheet having an outside surface disposed on an inside surface of said cabinet including said opening a surrounding key comprising a ring shape larger then said opening that is fixed on an outside surface of said elastic sheet;

a sliding key that is fixed on the outside surface of said elastic sheet with at least a portion in said opening of said cabinet surface;

sensors that at least detect movement in a horizontal direction that is substantially parallel to said cabinet surface of said sliding key; and switches that detect the movement in a vertical direction of said surrounding key.

6. An inputting device in accordance with claim 5, wherein:
said sliding key has a rim part whose diameter is larger than that of said opening.

7. An inputting device in accordance with claim 6, wherein:
said sliding key is adhered to said elastic sheet at said rim part;
a space is formed on a portion of the inside surface of said cabinet; and
at least a portion of said rim part of said sliding key is disposed in said space.

8. An inputting device in accordance with claim 5, further comprising:
a first control signal generating means that generates a first control signal corresponding to at least the moved direction of said sliding key detected by said sensors; and
a second control signal generating means that generates a second control signal corresponding to the pushed direction of one of the edges of said surrounding key detected by one of said switches; wherein:
said first control signal and said second control signal execute the change of the position of a subject to be controlled on a display.

9. An inputting device in accordance with claim 1, wherein:
a magnet is disposed in said sliding key, and
said sensors detect the moved direction and the amount of the horizontal movement of said sliding key based on the change of the magnetic flux density from said magnet corresponding to the movement of said sliding key.

10. An inputting device in accordance with claim 9, wherein:
said sliding key provides a concave part on a part of the surface where said sliding key is adhered to said elastic sheet, and
said sliding key is adhered to said elastic sheet by disposing said magnet in said concave part, and
said magnet is sealed in said sliding key.

11. An inputting device in accordance with claim 5, wherein:
a coil is disposed in said sliding key, and
said sensors detect the moved direction and the amount of the horizontal movement of said sliding key based on the electromotive force generated by the electromagnetic induction by the movement of said sliding key in the magnetic field of designated power formed at the surrounding part of said coil.

12. An inputting device, which is disposed in an opening of a cabinet surface, comprising:
an elastic sheet having an outside surface disposed on an inside surface of said cabinet including said opening and across said opening;
a sliding key that is fixed on the outside surface of said elastic sheet with at least a portion in said opening of said cabinet surface;
sensors that at least detect movement in a horizontal direction that is substantially parallel to said cabinet surface, of said sliding key;

a pushing component, which is made of a material that is harder than said elastic sheet and whose friction factor is smaller than that of said elastic sheet, and which is disposed on the inside surface of said elastic sheet at the position corresponding to said sliding key;

a contact switch disposed adjacent to said pushing component that detects that said sliding key was pushed in a vertical direction that is substantially perpendicular to said cabinet surface; and a third control signal generating means that generates a third control signal when said pushing component contacts said contact switch; wherein:
said third control signal executes the selection or the decision of information indicating by a subject to be controlled on a display.

13. An inputting device in accordance with claim 12, further comprising:
an ignoring means that ignores said third control signal, in case that the amount of the movement of said sliding key in said horizontal direction is larger than a predetermined value.

14. An inputting device in accordance with claim 12, further comprising:
a printed circuit board on which said contact switch is disposed; and
a sheet that covers said printed circuit board and said contact switch.

15. An inputting device in accordance with claim 1 or 5, further comprising:
a bellows portion having a ring shape formed in said elastic sheet outside the position where said sliding key is adhered to said elastic sheet.

16. An inputting device in accordance with claim 1 or 5, further comprising:
at least one of projections supporting said sliding key on the inside surface of said elastic sheet.

17. An inputting device in accordance with claim 1 or 5, further comprising:
a concave part formed on the outside surface of said sliding key.

18. An inputting device in accordance with claim 1 or 5, further comprising:
a nonskid component disposed on the outside surface of said sliding key.

19. An inputting device in accordance with claim 1 or 5, further comprising:
one or more projections formed on the outside surface of said sliding key.

20. An inputting device in accordance with claim 1 or 5, further comprising:
a plurality of openings in said cabinet surface; and
a group of keys formed on the front surface of said elastic sheet and each disposed in a corresponding opening of said plurality of openings.

21. A mobile terminal, comprising:
a cabinet surface having an opening;
an elastic sheet having an outside surface disposed on an inside surface of said cabinet including said opening and across said opening;
a sliding key that is fixed on the outside surface of said elastic sheet with at least a portion in said opening of said cabinet surface;
sensors that at least detect movement in a horizontal direction that is substantially parallel to said cabinet surface of said sliding key;
a displaying means that displays information;

a first controlling means that executes first control corresponding to at least the moved direction of said sliding key in said horizontal direction as detected by said sensors;
a pushing component, which is made of a material that is harder than said elastic sheet and whose friction factor is smaller than that of said elastic sheet, and which is disposed on the inside surface of said elastic sheet at a position corresponding to said sliding key;
a contact switch disposed adjacent to said pushing component that detects that said sliding key was pushed in a vertical direction that is substantially perpendicular to said cabinet surface; and
a third controlling means that executes third control when said pushing component made said contact switch work.

22. A mobile terminal in accordance with claim 21, wherein:
said sensors detect the movement and the amount of the movement of said sliding key in said horizontal direction, and
said first controlling means executes said first control corresponding to the moved direction and the amount of the movement of said sliding key.

23. A mobile terminal in accordance with claim 21, further comprising:
a control stopping means that stops said third controlling means, in case that the amount of the movement in the horizontal direction of said sliding key is larger than a predetermined value.

24. A mobile terminal in accordance with claim 21, further comprising:
a printed circuit board on which said contact switch is disposed; and
a sheet that covers said printed circuit board and said contact switch.

25. A mobile terminal in accordance with claim 21, wherein:
said first controlling means executes the change of the position displaying a subject to be controlled on said displaying means.

26. A mobile terminal in accordance with claim 21, wherein:
said third controlling means executes the selection or the decision of information indicating by said subject to be controlled on said displaying means.

27. A mobile terminal in accordance with claim 21, wherein:
said sliding key has a rim part whose diameter is larger than that of said opening
said sliding key is adhered to said elastic sheet at said rim part, and
a space is formed on a part of the inside surface of said cabinet at the position adjoining said opening part, and
said rim part of said sliding key is disposed in said space.

28. A mobile terminal, comprising:
a cabinet surface having an opening;
an elastic sheet having an outside surface disposed on an inside surface of said cabinet including said opening;
a surrounding key comprising a ring shape large than said opening that is fixed on an inside surface of said elastic sheet;
a sliding key that is fixed on the outside surface of said elastic sheet within at least a portion in said opening of said cabinet surface;
sensors that at least detect movement in a horizontal direction substantially parallel to said cabinet surface;
a displaying means that displays information;
a first controlling means that executes a first control corresponding to at least the horizontal movement of said sliding key; and
a second controlling means that executes a second control corresponding to the pushed direction of one of the edge parts of said surrounding key.

29. A mobile terminal in accordance with claim 28, further comprising:
a pushing component, which is made of a material that is harder than said elastic sheet and whose friction factor is smaller than that of said elastic sheet, and which is disposed on the inside surface of said elastic sheet at the position corresponding to said sliding key;
a contact switch disposed adjacent to said pushing component that detects that said sliding key was pushed in a vertical direction that is substantially perpendicular to said cabinet; and
a third controlling means that executes a third control when said pushing component made said contact switch work.

30. A mobile terminal in accordance with claim 28, wherein:
said sensors detect a moved direction and the amount of movement of said sliding key in the horizontal direction, and
said first controlling means executes said first control corresponding to the moved direction and the amount of the movement of said sliding key.

31. A mobile terminal in accordance with claim 29, further comprising:
a control stopping means that stops said third controlling means, in case that the amount of the horizontal movement of said sliding key is larger than a predetermined value.

32. A mobile terminal in accordance with claim 29, further comprising:
a printed circuit board on which said contact switch is disposed; and
a sheet that covers at least a portion of said printed circuit board and said contact switch.

33. A mobile terminal in accordance with claim 28, wherein:
said first controlling means and said second controlling means execute the change of the position displaying a subject to be controlled on said displaying means.

34. A mobile terminal in accordance with claim 29, wherein:
said third controlling means executes the selection or the decision of information indicating by said subject to be controlled on said displaying means.

35. A mobile terminal in accordance with claim 28, wherein:
said first controlling means executes the change of the position displaying a first subject to be controlled on said displaying means, and
said second controlling means executes the change of the position displaying a second subject to be controlled on said displaying means.

36. A mobile terminal in accordance with claim 35, wherein:
said third controlling means executes the selection or the decision of information indicating by said first or second subject to be controlled on said displaying means.

37. A mobile terminal in accordance with claim 28, wherein:
said sliding key has a rim part whose diameter is larger than that of said opening, said sliding key is adhered to said elastic sheet at said rim part, and a space is formed on a part of the inside surface of said opening, and said rim part of said sliding key is disposed in said space.

38. A mobile terminal in accordance with claim 21 or 30, wherein:

a magnet is disposed in said sliding key, and said sensors detect the moved direction and the amount of the movement of said sliding key in said horizontal direction based on the change of the magnetic flux density from said magnet corresponding to the movement of said sliding key.

39. A mobile terminal in accordance with claim 38, wherein:

said sliding key provides a concave part on a part of the surface where said sliding key is adhered to said elastic sheet, and said sliding key is adhered to said elastic sheet by disposing said magnet in said concave part, and said magnet is sealed in said sliding key.

40. A mobile terminal in accordance with claim 21 or 28, wherein:

guides being possible to be recognized optically are disposed on designated positions on said elastic sheet, and said sensors detect the moved direction and the amount of the movement of said sliding key in said horizontal direction by reading the movements of said guides optically corresponding to the movement of said sliding key.

41. A mobile terminal in accordance with claim 21 or 28, wherein:

a coil is disposed in said sliding key, and said sensors detect the moved direction and the amount of the movement of said sliding key in said horizontal direction based on the electromotive force generated by the electromagnetic induction by the movement of said sliding key in the magnetic field of designated power formed at the surrounding part of said coil.

42. A mobile terminal in accordance with claim 21 or 28, further comprising:

a bellows portion having a ring shape formed in said elastic sheet outside the position where said sliding key is adhered to said elastic sheet.

43. A mobile terminal in accordance with claim 21 or 28, further comprising:

at least one of projections supporting said sliding key on the inside surface of said elastic sheet.

44. A mobile terminal in accordance with claim 21 or 28, further comprising:

a concave part formed on the outside surface of said sliding key.

45. A mobile terminal in accordance with claim 21 or 28, further comprising:

a nonskid component disposed on the outside surface of said sliding key.

46. A mobile terminal in accordance with claim 21 or 28, further comprising:

one or more projections formed on the outside surface of said sliding key.

47. A mobile terminal in accordance with claim 21 or 28, further comprising:

a plurality of openings in said cabinet surface; and a group of keys formed on the front surface of said elastic sheet and each disposed in a corresponding opening of said plurality of openings.

* * * * *

UNITED STATES PATENT AND TRADEMARK OFFICE
CERTIFICATE OF CORRECTION

PATENT NO.        : 8,022,944 B2
APPLICATION NO.   : 10/623568
DATED             : September 20, 2011
INVENTOR(S)       : Daisuke Suzuki et al.

It is certified that error appears in the above-identified patent and that said Letters Patent is hereby corrected as shown below:

In the Specification

Column 8, Line 24: Delete "a'subject" and insert -- a subject --, therefor

Column 13, Line 55: Delete "position:" and insert -- position. --, therefor

In the Claims

Column 20, Line 67: In Claim 5, after "opening" insert -- ; --

Column 21, Line 1: In Claim 5, delete "then" and insert -- than --, therefor

Column 21, Line 34: In Claim 9, delete "1," and insert -- 5, --, therefor

Column 25, Line 6: In Claim 38, delete "30," and insert -- 28, --, therefor

Signed and Sealed this
Thirtieth Day of July, 2013

Teresa Stanek Rea
*Acting Director of the United States Patent and Trademark Office*